(12) United States Patent
Lyle et al.

(10) Patent No.: US 9,762,114 B2
(45) Date of Patent: Sep. 12, 2017

(54) SYNCHRONIZING PARALLEL POWER SWITCHES

(71) Applicant: MASCHINENFABRIK REINHAUSEN GMBH, Regensburg (DE)

(72) Inventors: Robin Lyle, Grantham (GB); Mark Snook, Histon (GB); Robert John Leedham, Cambridge (GB)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 15 days.

(21) Appl. No.: 14/894,583

(22) PCT Filed: Jun. 17, 2014

(86) PCT No.: PCT/GB2014/051850
§ 371 (c)(1),
(2) Date: Nov. 30, 2015

(87) PCT Pub. No.: WO2015/001311
PCT Pub. Date: Jan. 8, 2015

(65) Prior Publication Data
US 2016/0126822 A1 May 5, 2016

(30) Foreign Application Priority Data
Jul. 4, 2013 (GB) .................... 1311997.9

(51) Int. Cl.
*G05F 1/12* (2006.01)
*G05B 24/02* (2006.01)
(Continued)

(52) U.S. Cl.
CPC .......... *H02M 1/088* (2013.01); *H03K 17/127* (2013.01); *H03K 17/28* (2013.01)

(58) Field of Classification Search
CPC ..... G05F 1/20; G05F 1/30; G05F 1/33; G05F 1/44; G05F 1/462; G05F 1/59;
(Continued)

(56) References Cited

U.S. PATENT DOCUMENTS 4,746,812 A 5/1988 Andrejack
5,051,603 A 9/1991 Walker
(Continued)

*Primary Examiner* — Adolf Berhane
*Assistant Examiner* — Gary Nash
(74) *Attorney, Agent, or Firm* — Andrew Wilford

(57) ABSTRACT

The invention generally relates to methods and circuits for controlling switching of parallel coupled power semiconductor switching devices (3), for example for use in a power converter. In an example, there is provided a circuit for controlling switching of parallel coupled power semiconductor switching devices (3), the circuit comprising: a plurality of drive modules (2), each said module for controlling a said power semiconductor switching device (3); control circuitry to transmit switch command signals to the modules, each said switch command signal to trigger a said drive module to control a said power semiconductor switching device to switch state; and voltage isolation between the drive modules and the control circuitry, wherein each said drive module for controlling a said device comprises: timing circuitry (22) to compare a switching delay of the device and a reference delay, wherein said switching delay is a time interval between detecting a said switching command signal at the drive module and switching of the device in accordance with the detected switching command signal; and delay circuitry (21) to provide a controllable delay to delay a said triggering by a said switching command signal received at the module subsequent to the detected switching command signal, the delay circuitry configured to control the controllable delay according to a result of said comparison of said switching delay of the device, to thereby reduce a time difference between the reference delay and a said
(Continued)

switching delay of the device switching in accordance with the subsequent switching command signal.

26 Claims, 16 Drawing Sheets

(51) Int. Cl.

| | | |
|---|---|---|
| *H02J 1/00* | (2006.01) | |
| *H02J 3/12* | (2006.01) | |
| *G05B 11/01* | (2006.01) | |
| *H02M 5/42* | (2006.01) | |
| *H02M 7/68* | (2006.01) | |
| *H02M 3/24* | (2006.01) | |
| *H02M 7/44* | (2006.01) | |
| *H02M 7/538* | (2007.01) | |
| *H02M 1/088* | (2006.01) | |
| *H03K 17/12* | (2006.01) | |
| *H03K 17/28* | (2006.01) | |

(58) Field of Classification Search
CPC .......... G05F 1/595; H02M 2001/0012; H02M 1/081; H02M 1/082; H02M 1/088; H02M 1/092; H02M 1/096; H02M 2007/4822; H02M 2007/4826; H02M 7/515; H02M 7/5152; H02M 7/5155; H02M 7/5157; H02M 7/521; H02M 7/525; H02M 7/53; H02M 7/537; H02M 7/53875; H02M 7/53846; H02M 7/538466

USPC ....... 323/223–226, 247, 249, 252, 271, 272, 323/332, 333; 363/37, 78, 97, 98, 127, 363/131, 132, 134–138

See application file for complete search history.

(56) References Cited

U.S. PATENT DOCUMENTS

| | | | |
|---|---|---|---|
| 6,807,071 B1 * | 10/2004 | Zhang | H02M 1/08 363/131 |
| 7,369,420 B2 * | 5/2008 | Cebry | H02M 3/33523 363/21.01 |
| 2002/0175719 A1 * | 11/2002 | Cohen | H02M 1/088 327/108 |
| 2004/0056646 A1 | 3/2004 | Thalheim | |
| 2012/0043994 A1 | 2/2012 | Alvarez | |
| 2012/0098577 A1 * | 4/2012 | Lobsiger | H02M 1/088 327/109 |
| 2013/0328599 A1 | 12/2013 | Lobsiger | |

* cited by examiner $t_{difference} = t_{reference} - t_{switch}$ $t_{on} = t_{command} + t_{delay}$ If $t_{difference} > 0$ then increment $t_{delay}$ If $t_{difference} < 0$ then decrement $t_{delay}$

200

SYNCHRONIZING PARALLEL POWER SWITCHES

CROSS REFERENCE TO RELATED APPLICATIONS

This application is the US-national stage of PCT application PCT/GB2014/051850 filed 17 Jun. 2014 and claiming the priority of British patent application 1311997.9 itself filed 4 Jul. 2013.

FIELD OF THE INVENTION

The present invention generally relates to methods and circuits for controlling switching of parallel coupled power semiconductor switching devices, for example for use in a power converter.

BACKGROUND TO THE INVENTION

Power converters, such as AC to DC converters or DC to AC inverters, may comprise networks of parallel and/or series connected power switching devices such as insulated gate bipolar transistors (IGBTs). Such converters may be for applications ranging from low voltage chips, to computers, locomotives and high voltage transmission lines. More specific example applications are switching in high voltage dc transmission lines of the type which may, for example, carry power from an offshore wind installation, and medium voltage (for example greater than 1 KV) switching for motors and the like, for example locomotive motors.

A converter may comprise one or more controller(s), e.g., intelligent devices which determine the required state of a collection of power switching devices. Furthermore, the converter may comprise switching units, such as intelligent "gate drives" which control the state of an individual power-switching device. Sensors such as temperature or current sensors, and/or actuators such as a cooling system pump may further be provided. Examples of the power switching devices include bipolar devices such as IGBTs, field effect transistors (FETs) such as MOSFETS (vertical or lateral) and JFETs, and potentially devices such as LILETs (lateral inversion layer emitter transistors), SCRs and the like. The techniques described herein are however not limited to any particular type of general converter architecture or any particular type of power switching device.

The use of such devices connected in parallel may be desirable to provide the required output power. Such an arrangement may allow a modular solution whereby power output can be scaled around a common platform. Additionally or alternatively, benefits may include enhanced performance through lowered parasitics in a given topology, lower cost, and/or very high power output particularly at high voltage.

Considering operation of such a parallel arrangement, however, variances between devices and drive parameters (e.g., IGBTs and corresponding gate drive parameters; the gate drive comprising circuitry to drive the IGBT gate terminal) may mean that it is not sufficient merely to switch each device in response to an incoming signal, e.g., PWM signal from a central controller. Such simple switching control may lead to poor current sharing/balance between the parallel devices, for example if the timing variance is greater than a few 10s of nanoseconds, and this may affect reliability. In this regard, it is noted that some timing uncertainty may be introduced by skew on conventional command interfaces to the gate drives, in particular where high voltage isolation is required between the central controller and the gate drives, and this can similarly degrade synchronism of device switching. Similarly, where inductances are not completely balanced between each of the parallel connected devices, the voltage may not change synchronously on each device. This is highly likely when the separation of devices such as IGBT modules is large (due to their physical size).

Where conventional, simple switching control is implemented, the prospect of current imbalance generally leads designers to de-rate the devices by, e.g., 10-20%; the derating margin may however be higher for faster switching devices. Consequently, IGBT module users may employ more modules than necessary for a given application.

Thus, the field of power switching device control continues to provide a need for methods for providing advantage(s) such as, inter alia, improving current sharing between parallel connected power switching devices, cost, size, bill of materials (e.g., number of power switching device modules), reliability, and/or power consumption for a given application, etc.

For use in understanding the present invention, the following disclosures are referred to:

Decentralized Active Gate Control for Current Balancing of Parallel Connected IGBT Modules—Paper; Y. Lobsiger, et al—2011; available at http://www.pes.ee.ethz.ch/uploads/tx_ethpublications/15_Decentralized_Active_Gate_EPE2011.pdf; and Active Gate Control for Current Balancing of Parallel-Connected IGBT Modules in Solid-State Modulators—Paper; Johann W. Kolar, et al—2008; http://www.pes.ee.ethz.ch/uploads/tx_ethpublications/bortis_IEEETrans_ActiveGate.pdf.

SUMMARY

According to a first aspect of the present invention, there is provided a circuit for controlling switching of parallel coupled power semiconductor switching devices, the circuit comprising: a plurality of drive modules, each said module for controlling a said power semiconductor switching device; control circuitry to transmit switch command signals to the modules, each said switch command signal to trigger a said drive module to control a said power semiconductor switching device to switch state; and voltage isolation between the drive modules and the control circuitry, wherein each said drive module for controlling a said device comprises: timing circuitry to compare a switching delay of the device and a reference delay, wherein said switching delay is a time interval between detecting a said switching command signal at the drive module and switching of the device in accordance with the detected switching command signal; and delay circuitry to provide a controllable delay to delay a said triggering by a said switching command signal received at the module subsequent to the detected switching command signal, the delay circuitry configured to control the controllable delay according to a result of said comparison of said switching delay of the device, to thereby reduce a time difference between the reference delay and a said switching delay of the device switching in accordance with the subsequent switching command signal.

An embodiment may thus regulate switching delay(s) of power switching device(s) relative to their respective command signals, to reduce variance among the switching delays of the plurality of devices and/or to reduce variation of the switching delays of a device over time. Such variation/variance may arise due to factors such as, e.g., temperature, supply voltage, age, etc. of each device and/or of other devices in the circuit, e.g., in drive module(s).

Generally, an embodiment may advantageously allow the switching delay of each switching device coupled to a module to be controlled such that the delay is known and/or constant relative to the switching command. This may allow a full time delay from generating or outputting the switching command signal from the control circuitry to the associated switching of the device to be more predictable and/or very short, for example as may be achieved using a dedicated transmission line/channel for the switching command signals. Allowing the switching times of all devices to be known and/or constant relative to detection of the respective command signals may be advantageous for current sharing among such devices connected in parallel, since greater timing variation of switching of such devices may result in unequal current distribution among the devices. Preferably, the time differences of respective devices are therefore all reduced to substantially (e.g., exactly) zero so that the switching devices are controlled to equal the reference delays. Where such reference delays of modules are equal, the switching of the multiple devices on (off) may be simultaneous, for example where there is very low or substantially zero skew in command signal transmission from control circuitry to the modules.

It is noted that two or more power switching devices may be controlled by the same drive module, and/or a sub-group of the drive modules may be provided in a larger module. Regardless, an embodiment may be provided to adjust the controllable delay for any one or more of the devices based on a comparison as described above.

It is further noted that the control circuitry may be a controller for sending command signals to all of the modules. A switch command signal may a comprise a transition, e.g., low to high or digital '0' to '1' (or vice versa) to command the drive module to turn the device on (off), i.e., to become conductive, and conversely for switching a device off, i.e., to become substantially non-conductive, e.g., between collector and emitter or between source and drain of bipolar and field effect devices, respectively.

The voltage isolation of the control circuitry relative to the modules may comprise, e.g., transformer(s) and/or optocoupler(s), which may be suitable for allowing transmission of data and/or power. The isolation may comprise one or more isolators, e.g., one per module or per location having one or more modules.

For performing the comparison, the timing circuitry may comprise a timer to measure the switching delay of the device, the timing circuitry configured to perform the comparison by comparing the measured switching delay and a stored value of the reference delay, wherein said subsequent time difference reduction is relative to said measured time difference. Similarly as described above, the measurement may involve measure the duration of switching delay, e.g., measuring a time interval starting with the triggering of the drive module to switch the device and ending with the switching of the device, to thereby indicate the switching delay. The reduction of the subsequent time difference for a device, preferably all devices, is generally ideally to substantially (e.g., exactly) zero. Thus, any corresponding subsequent switching delay of a device will be substantially equal to the reference delay used for the comparison relating to the device. Such a reference delay may be, e.g., a parameter received and/or stored locally at the module driving the device, and/or may be implemented in hardware, e.g., by time-out of a timer/counter or shifting of a bit through a serial buffer having a length corresponding to the reference delay.

To allow a time difference to be gradually reduced, the circuit may be configured to, in response to each of a series of said measured time differences of a module, control a said controllable delay of the module to thereby reduce a following said time difference of the module by an amount less than the measured time difference, such that successive said time differences of the series converge toward zero. Reduction by the lesser amount may allow control a succession of command signals to a module to gradually reduce the time difference over a number of switching cycles (consecutive on period+off period) of the device. This may be advantageous for example where relatively large controllable delay adjustments are to be made in two or more drive modules at the same time.

Alternatively, the comparison may be performed by using the timing circuitry comprising a timer to indicate the end of a duration equal to the reference delay and starting from the command signal detection, the timing circuitry configured to perform the comparison comprising detecting whether the switching of the device occurs before, at and/or after the indicated end.

To compare the switching and reference delays, a timer may therefore be used to time from a timing trigger (e.g., detection of a switch command signal, e.g., upon receipt at the module) to the end of the reference delay, and/or a terminal (e.g., source, drain, collector or emitter) of a switching device may be monitored to detect the instant of switching of the device state. An embodiment may then detect whether the device switching happens before or after the end of the reference delay, and preferably how long before or after (e.g., how many clock cycles before/after). It is however noted that the comparison may involve comparing a measurement switching time to a stored reference delay value, or may involve timing to indicate the end of the reference delay to thereby be able to detect whether the state switch occurs before, at or after the reference delay, i.e., whether the switching delay is shorter, equal to or longer than the reference delay.

For improved synchronisation, each drive module may be configured to perform a said comparison based on a reference delay of the module, the reference delays of the modules having values to substantially synchronise switching of said power switching devices when switching command signals to trigger control of the devices to switch state are received by the modules substantially simultaneously. If the values are equal and there is a very low or substantially zero skew between arrival of command signals at different modules, this may result in highly synchronised switching of devices. Advantageously, this may provide good current sharing among the devices.

Where each said drive module is configured to implement a said control of a said controllable delay, variance among currents conducted by the devices when the devices are simultaneously switching may be reduced. For example, variance among source-drain or emitter-collector currents conducted by the devices when the devices are simultaneously switching may be reduced. In this regard, it is noted that synchronised switching generally reduces current variance during switching, which in turn may help with static current sharing, but may not in itself balance current between modules that are fully on. This can be seen in FIG. 6a, where the currents in each module tend to converge naturally.

There may further be provided the circuit, wherein the control circuitry is configured to control when each said drive module performs a said controllable delay control. The control circuitry may then be able to ensure that controllable delays are updated simultaneously for all modules and/or devices, e.g., by adjusting controllable delay elements at respective drive modules at substantially the same time. This may reduce the likelihood of the drive modules/devices getting out of synchronism. Additionally or alternatively, if error signals based on the time differences of the drive modules are transmitted to the control circuitry, the control circuitry may apply an averaging or other function based on the time differences of respective modules and/or devices and return a controllable delay adjustment value to each drive module accordingly, to determine a change to the one or more controllable delays. Further additionally or alternatively, the reference delay of each drive module may be programmable for example by the control circuitry.

In an embodiment, wherein the delay circuitry comprises a controllable timer and is configured to adjust a timing period value of the timer to implement said controllable delay, the timer preferably configured to control a buffering time of a said switching command signal, and/or wherein the delay circuit is configured to adjust a drive strength of the subsequent switching command signal to thereby implement said controllable delay. Such drive strength control may involve adjusting a drive strength control parameter when generating the command signal and/or attenuating or amplifying the received and/or detected command signal. However, the delay may be implemented using a controllable timer to time buffering of the signal, so that the delay is controlled by setting a time delay parameter to control the buffering duration.

There may further be provided the circuit, wherein at least one said drive module for controlling a said device is configured to measure a first said time difference of the module and a second said time difference of the module, wherein: the first measured time difference is a turn on time difference between a first said reference delay and a said switching delay of the device turning on; and the second measured time difference is a turn off time difference between a second said reference delay and a said switching delay of the device turning off, wherein the drive module is configured to: control a said controllable delay of the drive module according to the turn on time difference to thereby reduce a subsequent said turn on time difference of the drive module; and control a said controllable delay of the drive module according to the turn off time difference to thereby reduce a subsequent said turn off time difference of the drive module, wherein the turn on reference delay and the turn off reference delay are substantially equal (noting that in other embodiments they may not be). Such equality of the turn-on and turn off reference delays may allow the state switching of a device to precisely follow the transitions of a switch command signal, e.g., the of a pulse width modulated (PWM) switch command signal.

In a preferred embodiment, the circuit is provided to control the power switching devices of a bridge circuit, e.g., full or half bridge. The power semiconductor switching devices comprise lower and upper switching devices of a phase leg of the bridge circuit, wherein: a said drive module is configured to perform a said comparison and a said controllable delay control based on the comparison, to thereby control delay of a said triggering by a said switch command signal received at the drive module for controlling the lower device; and a said drive module is configured to perform a said comparison and a said controllable delay control based on the comparison, to thereby control delay of a said triggering by a said switch command signal received at the drive module for controlling the upper device, the bridge circuit to thereby reduce a deadtime between switching of the lower and upper devices.

There may further be provided the circuit, comprising a fibre-optic interface, the control circuitry configured to perform said switch command signal transmission via the fibre-optic interface. Where a comparison result is sent by the module to the control circuitry, e.g., as an error signal, this may be sent over the same interface.

There may further be provided the circuit, comprising a dedicated electrical interface for said switch command signal transmission, the control circuitry configured to perform said switch command signal transmission via the dedicated electrical interface.

There may further be provided the circuit, wherein the power semiconductor switching devices comprise at least one IGBT.

In a preferred embodiment, there is provided a power converter comprising the circuit of any preceding claim. Such a converter may be for ac-dc conversion, however may alternatively be a dc-ac inverter.

According to a second aspect of the present invention, there is provided a method of controlling switching of parallel coupled power semiconductor switching devices, the method using control circuitry to transmit switch command signals to drive modules, said drive modules voltage isolated from the control circuitry, each said switch command signal to trigger a said drive module to control a said power semiconductor switching device to switch state, the method comprising performing for each said device the steps of: comparing at a said drive module a switching delay of a said device and a reference delay, wherein said switching delay is a time interval between detecting a said switch command signal at the drive module and switching of the device in accordance with the detected switching command signal; and controlling a controllable delay of the drive module to delay at least one said triggering by a said switch command signal subsequent to the detected switch command signal, said controlling according to a result of the comparison, to thereby reduce a time difference between the reference delay and a said switching delay of the device in accordance with the subsequent switching command signal.

Thus, similarly as for the first aspect, a comparison may be performed for a turn on (off) in a first switching cycle of a device, and used to control a time difference of a later turn on (off), preferably in a following switching cycle.

There may further be provided the method, performing said steps for a said power semiconductor switching device, wherein said switching of a said device comprises said device turning on; performing the steps for the said power semiconductor switching device, wherein said switching of a said device comprises said device turning off; wherein the reference delay compared to a switching delay of the turning on of the device and the reference delay compared to a switching delay of the turning off of the device are substantially equal.

There may still further be provided the method, wherein said power semiconductor switching devices comprise lower and upper devices in a phase leg of a bridge circuit, the method comprising performing said steps for each of said lower and upper devices, to reduce a dead time between switching of the lower and upper devices. During such a dead time, both devices may be off, i.e., the phase leg may be non-conductive overall.

There may yet further be provided the method, wherein the comparison comprises measuring at the drive module a time difference between the reference delay and the switching delay of the device and comparing the measured time difference and a stored value of the reference delay, wherein said reduced time difference is relative to said measured time difference. Such measuring may involve measuring between the end of the reference delay and a time of detecting state switching of the device.

There may further be provided the method, wherein a said controlling said controllable delay comprises a series of adjustments of a controllable delay element over a plurality of switching cycles of the device, to thereby reduce a said time difference gradually.

To determine a turn on reference delay for use as the reference delay in the second aspect, an embodiment may comprise determining a turn on reference delay for a said comparison to a said switching delay of a said device, a said switching delay being a turn on delay of the device relative to a said trigger to turn the device on, said determining on the basis of at least one of: a compliance voltage of a power supply for powering at least one said drive module; maximum input resistance (e.g., gate drive ON resistor max tolerance, otherwise referred to a 'RON max) of a terminal to drive said power semiconductor switching device in an on state; a maximum turn-on threshold voltage of the power semiconductor switching devices, preferably at a minimum desired temperature (e.g., maximum IGBT threshold voltage at minimum temperature); and/or a maximum control terminal capacitance of the power semiconductor switching devices (e.g., the maximum gate capacitance Cg of all such capacitances of the devices; Cg may comprise a gate-collector capacitance Cgc and a gate-emitter capacitance in parallel for an IGBT).

Similarly, to determine a turn off reference delay for use as the reference delay in the second aspect, an embodiment may comprise determining a turn off reference delay for a said comparison to a said switching delay of a said device, a said switching delay being a turn off delay of the device relative to a said trigger to turn the device off, said determining on the basis of at least one of: a compliance voltage of a power supply for powering at least one said drive module; maximum input resistance (e.g., gate drive OFF resistor max tolerance, otherwise referred to as 'ROFF max) of a terminal to drive said power semiconductor switching device in an off state; a minimum turn-off threshold voltage of the power semiconductor switching devices (e.g., maximum IGBT threshold voltage at minimum temperature), preferably at a maximum desired temperature; and/or a maximum control terminal capacitance of the power semiconductor switching devices (as described above).

Where both of the above reference delay determination embodiments are used, each reference delay to be used for a said comparison may be determined to be equal to the larger of the determined turn on reference delay and the determined turn off reference delay.

There may further be provided a computer program operable to determine a said reference delay for the method, said determining on the basis of at least one of: a minimum power semiconductor switching device turn-off threshold voltage (e.g., maximum IGBT threshold voltage at minimum temperature), preferably at a maximum desired temperature; a maximum power semiconductor switching device turn-on threshold voltage (e.g., maximum IGBT threshold voltage at minimum temperature), preferably at a minimum desired temperature; a maximum power semiconductor switching devices control terminal capacitance (e.g., as described above); a minimum temperature, which may be internal or external to a power converter and/or a temperature specifically of the device; a maximum temperature (similarly internal or external or relating specifically to the device temperature); a minimum positive supply voltage to a drive module; a maximum negative supply voltage to a drive module; a maximum input resistance of a terminal to drive a said power semiconductor switching device in an on state (e.g., gate drive ON resistor max tolerance, otherwise referred to as 'RON max); a maximum input resistance of a terminal to drive a said power semiconductor switching device in an off state (e.g., gate drive OFF resistor max tolerance, otherwise referred to as 'ROFF max); and/or a maximum propagation delay of a said drive module for driving a said power switching device, the delay from receiving a switch command signal at the drive module to said drive module activating switching of the power semiconductor device.

According to a third aspect of the present invention, there is provided a circuit for controlling switching of parallel coupled power semiconductor switching devices, the circuit comprising control circuitry to transmit switch command signals to drive modules, each said switch command signal to trigger a said drive module to control a said power semiconductor switching device to switch state, the circuit comprising for each said drive module: means for comparing at a said drive module a switching delay of a said device and a reference delay, wherein said switching delay is a time interval between detecting a said switch command signal at the drive module and switching of the device in accordance with the detected switching command signal; and means for controlling a controllable delay of the drive module to delay at least one said triggering by a said switch command signal subsequent to the detected switch command signal, said controlling according to a result of the comparison, to thereby reduce a time difference between the reference delay and a said switching delay of the device in accordance with the subsequent switching command signal.

According to a further aspect of the present invention, there is provided a bridge circuit comprising circuitry for controlling switching of power semiconductor switching devices, the circuit comprising: a plurality of drive modules, each said drive module for controlling a said power semiconductor switching device; control circuitry to transmit switch command signals to the modules, each said switch command signal to trigger a said drive module to control a said power semiconductor switching device to switch state; and voltage isolation between the drive modules and the control circuitry, wherein each said drive module for controlling a said device comprises: timing circuitry to compare a switching delay of the device and a reference delay, wherein said switching delay is a time interval between detecting a said switching command signal at the drive module and switching of the device in accordance with the detected switching command signal; and delay circuitry to provide a controllable delay to delay a said triggering by a said switching command signal received at the module subsequent to the detected switching command signal, the delay circuitry configured to control the controllable delay according to a result of said comparison of said switching delay of the device, to thereby reduce a time difference between the reference delay and a said switching delay of the device switching in accordance with the subsequent switching command signal, wherein the power semiconductor switching devices comprise lower and upper switching devices of a phase leg of the bridge circuit, wherein: a said drive module is configured to perform a said comparison and a said controllable delay control based on the comparison, to thereby control delay of a said triggering by a said switch command signal received at the drive module for controlling the lower device; and a said drive module is configured to perform a said comparison and a said controllable delay control based on the comparison, to thereby control delay of a said triggering by a said switch command signal received at the drive module for controlling the upper device, the bridge circuit to thereby reduce a deadtime between switching of the lower and upper devices.

This aspect may be combined with any one or more of the optional features of the first aspect, wherein the parallel coupled power switching devices as referred to in relation to the first aspect are replaced by the lower and upper switching devices as referred in relation to this aspect.

In a different arrangement, the upper and lower devices may be replaced by switching devices in respective parallel phase legs of a bridge circuit having two or more phase legs in parallel, the arrangement allowing a reduction in switching delay of one parallel device relative to the other rather than a reduction in deadtime between switching of series devices.

According to a further aspect of the present invention, there is provided a method of controlling switching of power semiconductor switching devices, the method using control circuitry to transmit switch command signals to drive modules, said drive modules voltage isolated from the control circuitry, each said switch command signal to trigger a said drive module to control a said power semiconductor switching device to switch state, the method comprising performing for each said device the steps of: comparing at a said drive module a switching delay of a said device and a reference delay, wherein said switching delay is a time interval between detecting a said switch command signal at the drive module and switching of the device in accordance with the detected switching command signal; and controlling a controllable delay of the drive module to delay at least one said triggering by a said switch command signal subsequent to the detected switch command signal, said controlling according to a result of the comparison, to thereby reduce a time difference between the reference delay and a said switching delay of the device in accordance with the subsequent switching command signal, wherein said power semiconductor switching devices comprise lower and upper devices in a phase leg of a bridge circuit, the method comprising performing said steps for each of said lower and upper devices, to reduce a dead time between switching of the lower and upper devices.

This aspect may be combined with any one or more of the optional features of the second aspect, wherein the parallel coupled power switching devices as referred to in relation to the second aspect are replaced by the lower and upper switching devices as referred in relation to this aspect.

In a different technique, the upper and lower devices may be replaced by switching devices in respective parallel phase legs of a bridge circuit having two or more phase legs in parallel, the technique allowing a reduction in switching delay of one parallel device relative to the other rather than a reduction in deadtime between switching of series devices.

Preferred embodiments are defined in the appended dependent claims.

Any one or more of the above aspects and/or any one or more of the above optional features of the preferred embodiments may be combined, in any permutation.

BRIEF DESCRIPTION OF THE DRAWINGS

For a better understanding of the invention and to show how the same may be carried into effect, reference will now be made, by way of example, to the accompanying drawings, in which:

FIG. 11 shows paralleled gate signals with offset timing to result in coincident turn-on;

DETAILED DESCRIPTION OF PREFERRED EMBODIMENTS

Figure 4:
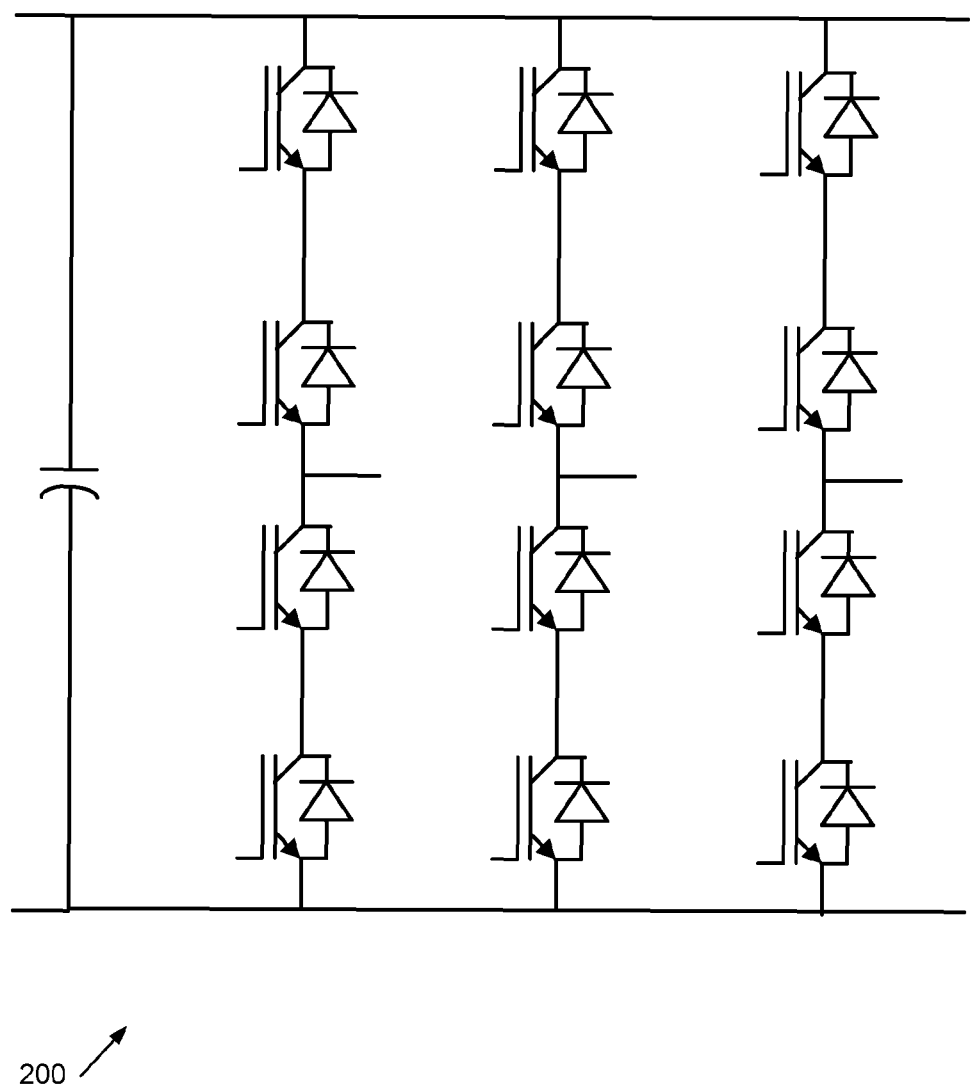
FIG. 4 shows a network of switching devices (represented merely for example as IGBTs) as may be found in a converter embodiment, e.g., a multiple phase leg inverter, wherein each switching device may be driven by a drive module for example as shown in FIGS. 1 to 3.

An embodiment provides a method applicable to a power converter such as an AC to DC converter or a DC to AC inverter. Merely for example, FIG. 4 shows a multiple phase leg inverter having two IGBTs stacked in each of the upper and lower sides of each phase leg. A single- or multiple phase leg inverter may be provided as the power switching apparatus 4 of FIG. 5(*a*) comprising on the device side one or more phase legs having IGBTs coupled to be controlled by drive modules in the form of gate drivers 2. The drive modules are each coupled to be controlled by control circuitry in the form of controller 1 on the control side.

Figure 5A:
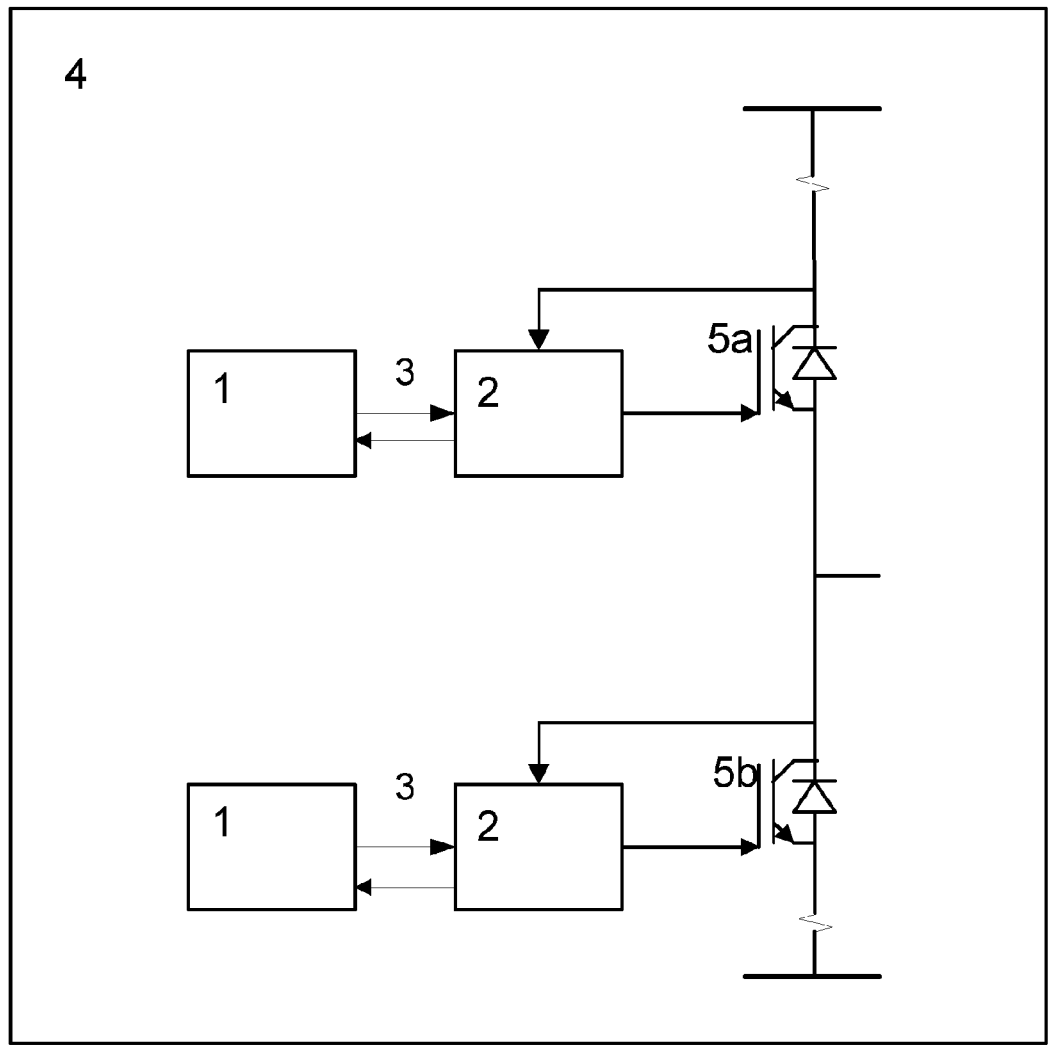
FIGS. 5(a) shows control circuitry blocks within a power switching apparatus such as an inverter; such an apparatus may have one or more power switching devices 5a, 5b in each phase leg half of one or more phase legs, and each drive module 2 (such as the drive module 2a or 2b of FIG. 1) may be coupled to a respective controller 1 and/or a plurality of drive modules 2 may be coupled to a controller 1 in common, the drive modules 2 being voltage isolated from the controller(s) 1.
Figure 5B:
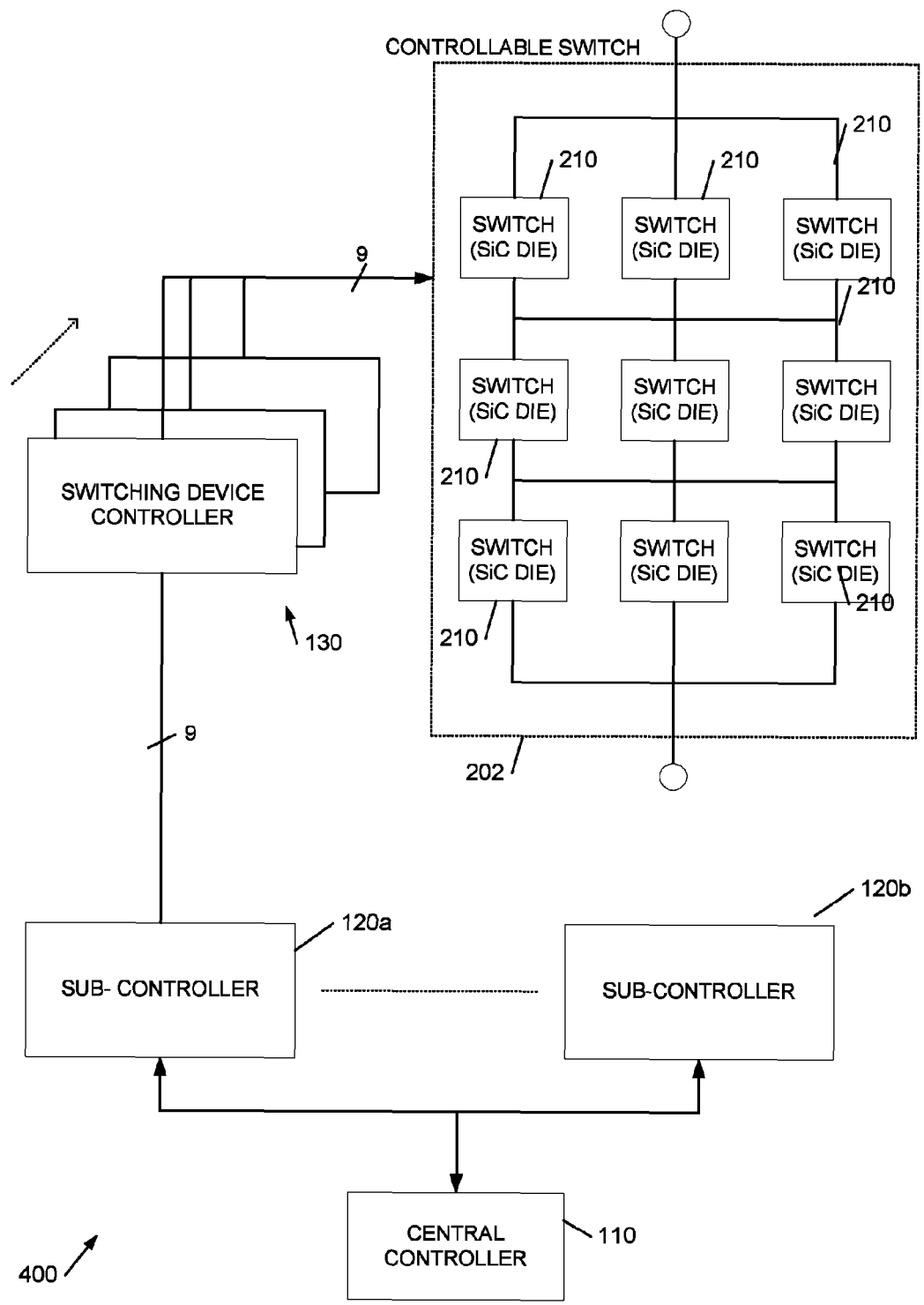
FIG. 5(b) shows an alternative arrangement to FIG. 5(a)

The power switching devices 5*a*, 5*b* of FIG. 5(*a*) are shown as IGBTs, however may additionally or alternatively comprise one or more FETs (e.g., MOSFETS or JFETs), LILETs, SCRs, etc. Each such device 5*a*, 5*b* is shown as having an optional freewheel diode connected in parallel, for protection of the switching device against reverse voltages and currents.

Coupling between each drive module and corresponding controller preferably provides voltage isolation for example by means of transformer- or opto-coupling. Thus, each uni- or bi-directional link 3 of FIG. 5(*a*) may comprise optical fibre (e.g., an optical fibre for communication in both directions, or a respective such fibre for each direction) or a transformer.

As the skilled person will recognise for example with regard to FIG. 4, circuitry not shown in FIG. 5(*a*) may be present, in particular one or more power switching devices may be present in either or both of the lines to the supply rails (e.g., VSS and 0V)—these lines are interrupted in FIG. 5(*a*) to indicate this.

The expanded diagram of FIG. 5(*b*) shows a similar, but larger scale system in which a single controllable switch network 202 comprises nine power semiconductor switching devices 210, for example each comprising a silicon carbide die, multiple devices being connected in parallel to create a voltage level, sets of multiple devices then being connected in series to series-connect the voltage levels. In other arrangements a single drive module 130 may control two or more switches or device dies. Each power switching device 210 of FIG. 5(*b*) has a respective drive module 130 which, in turn, is coupled to one of the sub-controllers 120*a*, *b*. As illustrated a separate bus runs between a sub-controller and a drive module so that there is one such bus for each drive module, but this is merely by way of example. In a high-voltage and/or current power electrical circuit with multiple switches hundreds or potentially thousands of semiconductor switching devices may be employed connected in series and/or parallel and the drive modules control the switching of these devices so that they switch in synchronism, in effect substantially simultaneously. Use of controllable delays as described herein may improve such synchronism.

A method embodiment for synchronising the switching of such parallel connected power devices (IGBT, MOSFET etc.) preferably ensures good current sharing. An adaptive mechanism is proposed for such an embodiment, where the time to switch (switching delay) is measured, compared to a reference time (reference delay), and then the gate drive (drive module) behaviour changes on the next cycle to ensure that the current in all IGBTs changes synchronously at the reference time (end of the reference delay). The change to the gate drive could be implemented by a timed delay to the switching command signal and/or associated gate drive signal to the device, and/or a change in the drive strength of the switching command signal and/or gate drive signal.

The mechanism may rely on each drive module (e.g., gate drive) detecting an event at the same time, within a few nanoseconds of each other, (the synchronous event) and making a measurement from that event to the change of current in the IGBT (the asynchronous event). Thus, the timing and measurement functions are in an embodiment split into two parts. Timing synchronisation may be aided by control circuitry in the form of a "parallel controller" which acts as master timing reference, with dedicated low skew electrical interfaces to the parallel connected drive modules (gate drives). The high voltage signal isolation is generally maintained between the central controller and the parallel controller, but is not required at least between each gate drive as they operate at roughly the same potential.

The change of current may be measured either directly or by integration of dI/dt.

The reference delay may be predetermined, e.g., hard-wired, or communicated to each gate drive; in either case it may be stored locally at the drive module. Preferably the delay is programmable using, e.g., re-programmable memory such as EEPROM, e.g., flash memory. Such a reference may mean that all IGBTs switch at a known time from the synchronous event, rather than just at the same time.

One benefit of an embodiment is that the pulse width of the switched current may accurately match the incoming switching signal if the turn on and turn-off reference delays are chosen to be the same.

An additional or alternative benefit is that the timing of current commutation may be known accurately, and this can be used to reduce dead-time between upper and lower devices in a phase leg of a converter. Prolonged dead-time may otherwise lead to distortion in the generated voltage and/or current waveforms which is undesirable.

An embodiment may reduce costs of an overall system, for example by improving current sharing such that derating margins can be reduced and thus fewer switching devices employed in a switching apparatus such as an inverter. Any extra complexity added to the gate drive in the embodiment is generally small. The circuits used to detect current changes may also be used for condition monitoring purposes.

Figure 1:
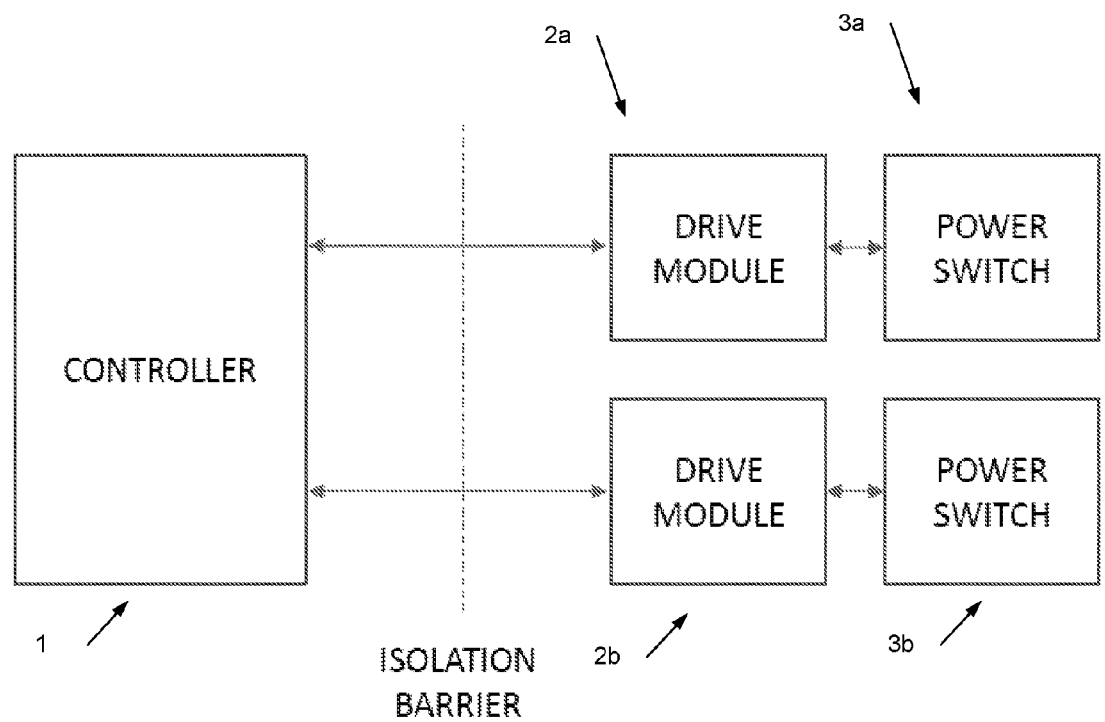
FIG. 1 shows a block diagram of a system embodiment comprising drive modules.

The example embodiment shown in FIG. 1 comprises drive modules 2*a*, 2*b* and power switching devices 3*a* and 3*b*. Control circuitry in the form of a controller 1 is coupled to the drive modules by respective communications links across a voltage isolation barrier.

Figure 2:
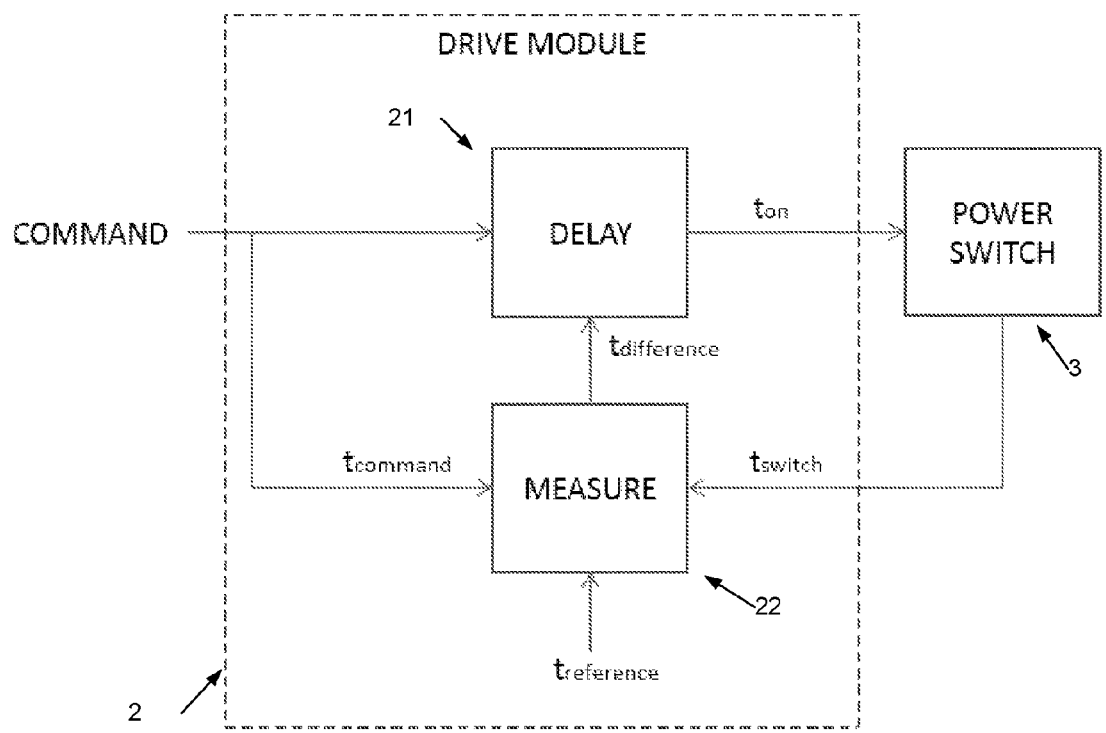
FIG. 2 shows a block diagram of a drive module of FIG. 1, wherein $t_{difference}=t_{reference}-t_{switch}$ and $t_{on}=t_{command}+t_{delay}$.

FIG. 2 shows in more detail a drive module 2 corresponding to module 2*a* and/or 2*b* of FIG. 1. The drive module 2 is coupled to receive at delay circuitry 21 of the module a switching command signal ('COMMAND') from control circuitry for example in the form of controller 1 of FIG. 1, the command signal to trigger the power switching device 3 to turn on (off). Thus, in response to the command signal (e.g., a signal transition on the command signal input line to the delay circuitry 21), the delay circuitry 21 sends a turn on signal (gate drive signal) at time $t_{on}$ (alternatively a gate drive signal in the form of a turn off signal at a time $t_{off}$) to the device 3 corresponding to device 3*a* or 3*b* of FIG. 1. Timing circuitry such as measure unit 22 receives from the power switching device 3 a switching indicator at time $t_{switch}$. The indicator preferably explicitly indicates a time $t_{switch}$ when the device has changed state or has started to change state (it is generally better to align the point at which the transition starts for both turn-on and turn-off; this can be detected by looking for a change in di/dt or an absolute value of current), e.g., when the current conducted by the device has become substantially zero (for turn off) or reached or a predetermined maximum current (for turn on). For example, the switching indicator at time $t_{switch}$ may be obtained by monitoring the collector current of the power switching device 3 in the form of an IGBT and thresholding to indicate the switching instant. The switching command signal commanding a turn on (off) at command time $t_{command}$, is further input to the measure unit 22, in addition to an indicator of reference delay $t_{reference}$. The reference delay indicator may for example be a reference delay value or a signal transition occurring at a timed reference delay after the command time. The measure unit provides a time difference indicator $t_{difference}$ to the delay unit 21 based on comparing and/or evaluating time instant $t_{switch}$ relative to $t_{reference}$. For example, the time difference between signal transitions at $t_{reference}$ and $t_{switch}$, or between the reference delay and a switching duration relative to detecting the switching command signal as indicated by $t_{switch}$, may be timed so that $t_{difference}$ is a value of the time interval between $t_{reference}$ and $t_{switch}$. Alternatively, $t_{difference}$ may merely indicate whether $t_{reference}$ occurs before, at and/or or after $t_{switch}$. The outputting of the turn on (off) signal to the device 3 in accordance with a subsequent switching command signal will then delayed relative to the command time $t_{command}$ of the subsequent command signal in accordance with $t_{difference}$. Thus, the time $t_{on}$ ($t_{off}$) of a turn on (off) signal may be delayed by a delay value $t_{delay}$ to a measured $t_{difference}$, or may be delayed or brought forward by a predetermined time increment/decrement depending on whether $t_{switch}$ occurred before or after $t_{reference}$. The controllable delay value $t_{delay}$ is preferably such that a following switching event of the device will have a smaller magnitude of $t_{difference}$, e.g., zero.

Figure 3A:
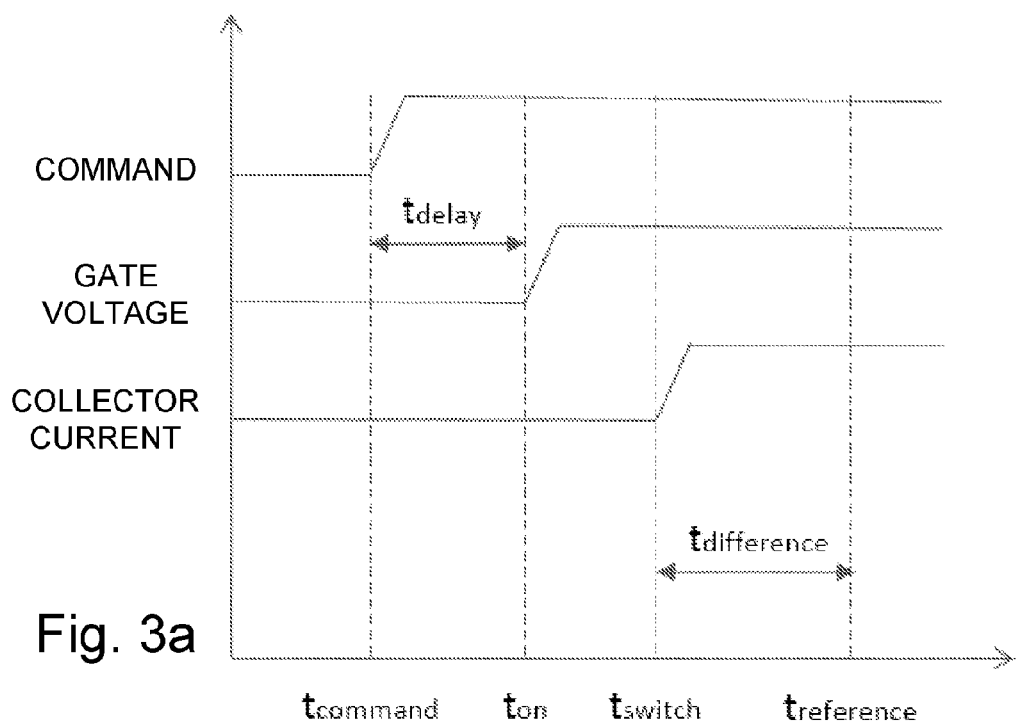
FIGS. 3a and 3b show timing diagrams for the embodiment of FIGS. 1 and 2, wherein $t_{difference}=t_{reference}-t_{switch}$ and $t_{on}=t_{command}+t_{delay}$.
Figure 3B:
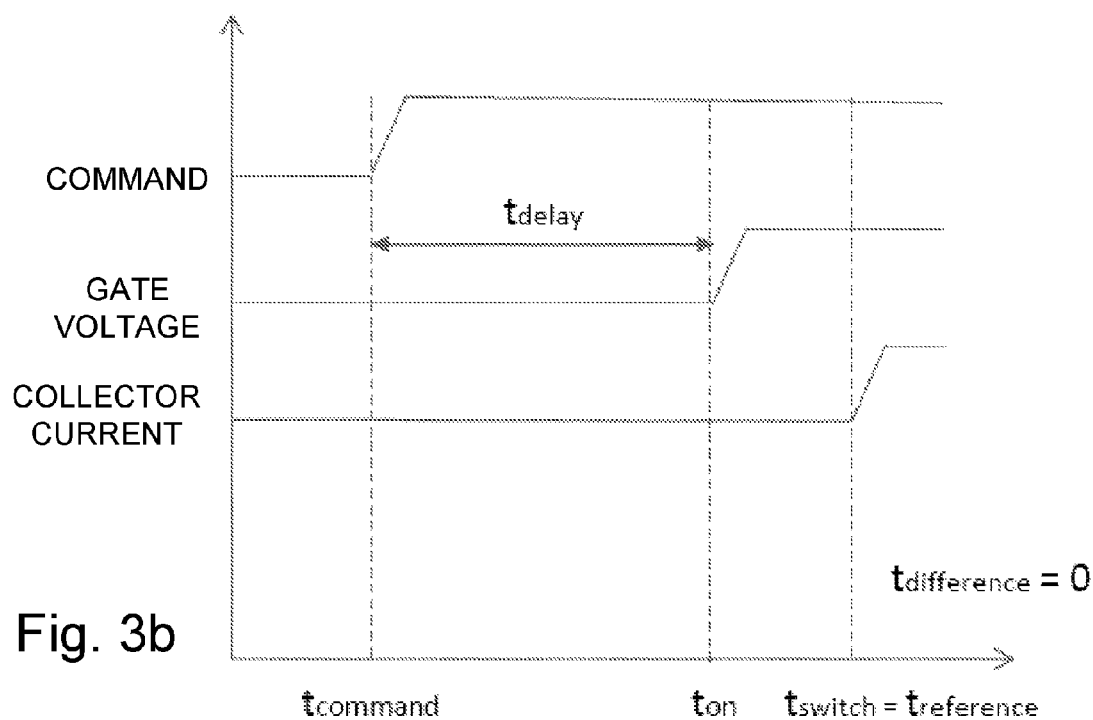

Consistent with the above, FIG. 2 operates such that a measured $t_{difference} = t_{reference} - t_{switch}$ and a turn on time $t_{on} = t_{command} + t_{delay}$, and:

If $t_{difference} > 0$ then increment $t_{delay}$
If $t_{difference} < 0$ then increment $t_{delay}$ Such operation is shown in the timing diagrams of FIGS. 3a and 3b illustrating a switching command signal transition at time $t_{command}$, followed by a turn on signal (gate voltage for an insulated gate device such as an IGBT) at a delay $t_{delay}$ after $t_{command}$. The switching instant $t_{switch}$ of the device turning on is shown as the instant a collector current increases from its off state. For ease of illustration, the end of the reference delay is indicated as $t_{reference}$. Thus, the time difference $t_{difference}$ is shown as the difference between switching instant $t_{switch}$ and $t_{reference}$. This time difference is used to adjust a delay of a following turn on of the device which is shown in FIG. 3b. Thus, the time value of $t_{difference}$ of FIG. 3a has been added to the reference delay $t_{delay}$ of FIG. 3a such that the new value of $t_{delay}$ as shown in FIG. 3b postpones the switching instant $t_{switch}$ to occur at the end of the reference delay, i.e., as $t_{reference}$ as shown in FIG. 3b. Consequently, the subsequent value of $t_{difference}$ as shown in FIG. 3b is zero.

Figure 13:
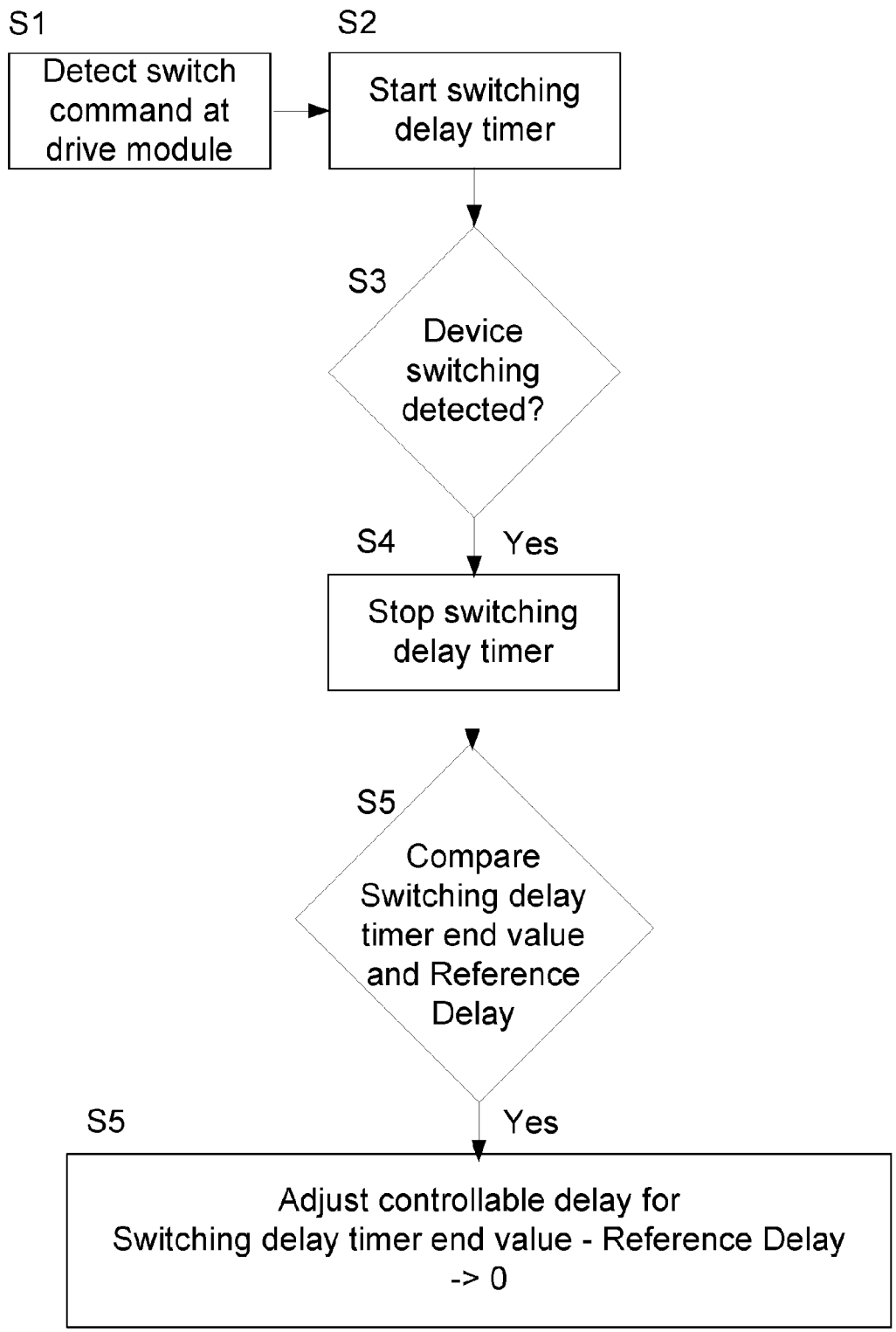
FIG. 13 shows a flow diagram of an embodiment.

A flow diagram of a method embodiment operating similarly as described above is shown in FIG. 13. In this embodiment, it is assumed that the reference delay is stored as a fixed time interval value. Broadly, steps S1 to S4 time measure the switching delay from the detection at the drive module of a switch command (e.g., a signal transition) triggering turn on (off) of a device to the instant of the device switching state accordingly. The timed interval is compared to the stored reference delay value. An adjustment is made to a controllable delay, which is to delay a subsequent command signal triggering such a state change. Preferably the adjustment is to reduce the size of the difference between the reference delay and switching delay during the next turn on (off) of the device, further preferably such that the difference approaches or becomes zero.

An embodiment as discussed above may be preferable to an approach that aims to improve switching synchronism merely by including additional communication channels between gate drives. Such an approach may not be commercially viable due to the cost of extra cabling and connectors.

As indicated above, embodiments may be implemented to improve switching synchronisation of parallel devices, for example where parallel operation of IGBT modules is being employed for reason(s) such as:

desire to have a modular solution where power output can be scaled around a common platform;
new packages that both enhance performance through lowered parasitics in a given topology and/or are lower in cost; and/or
very high power output systems (particularly at high voltage) that can only achieve the required power through multiple modules.

In theory, if all the IGBTs had the same characteristics, were operated at the same temperature and the gate drivers had identical time delays then parallel operation might not be an issue. In practice, however, there are a number of variables that result in a big shift from this ideal scenario. Factors that may affect the performance of the current sharing are the turn-on synchronisation due to differences in drive timing and IGBT threshold voltage and the collector current slope ($dI_C/dt$). Factors that affect the current slope for a resistor based drive are highlighted in the following IGBT equation:

$$\frac{dI_C}{dt} = \frac{V_G - V_{th}}{\frac{R_G C_{GS}}{g_m} + L_p} \quad (1)$$

where: $V_G$ is the gate drive voltage, $V_{th}$ is the IGBT threshold voltage, $R_G$ is the gate driver resistance, $C_{GS}$ is the IGBT gate-source capacitance, $g_m$ is the IGBT transconductance and $L_p$ is the parasitic inductance of the particular branch of the power circuit.

The following table highlights some of the variables and their impact on both static (during the on period) and dynamic (during the switching transitions) current sharing:

TABLE 1

Static and dynamic dependencies of current mismatching in parallel connection.

|  | Static current symmetry | Dynamic current symmetry |
| --- | --- | --- |
| DC-bus stray inductance | o | ++ |
| AC output inductance | + | + |
| Temperature difference between IGBT modules | ++ | ++ |
| IGBT Saturation voltage VCEsat | ++ | o |
| Diode Forward voltage VF |  |  |
| Gate-emitter threshold voltage (VGE) | o | ++ |
| AC output resistance | ++ | o |
| DC-link resistance | ++ | o |
| Gate drive voltage | + | + |
| Gate turn-on and turn-off delay time | o | ++ |
| Gate loop resistance | o | ++ |
| Gate loop induction | o | ++ |
| Magnetic field influence | o | + |

Considering firstly IGBT tolerances, the following is noted:

IGBT threshold voltage may typically have a tolerance of 1V and parallel modules may turn on at different times as this $V_{th}$ is reached. Turning on may be defined as the point where this voltage is reached and the IGBT conducts current. Turning off may be defined as the opposite when this threshold is passed through in a negative going direction and the IGBT is considered to be off.

IGBT input capacitance may vary from module to module resulting in varying time when this threshold is reached.

Both these characteristics as well as transconductance may impact the rate of change of current at turn on and off ($dI_c/dt$). Generally, the $dI_c/dt$ directly impacts the balancing of current sharing even with perfectly synchronised switching timing.

To alleviate these problems, power stack manufacturers may try to use modules from the same production batch of silicon which are more likely to have closer characteristics. In addition, selection and matching may be adopted. Both approaches cost time and money and result in decreased flexibility and potential future problems if IGBTs need to be replaced. In addition this is not a cure-all solution as other system variations may still impact the current sharing.

If switching timings are not aligned then IGBTs may have to momentarily support large currents under normal switching and short circuit conditions.

Considering gate driver (drive module) characteristics, the following is noted:

Regarding gate resistor tolerance, even when a single gate driver is used with multiple gate connections to paralleled modules, variations in the gate resistance may cause differing currents and timing in the switching characteristics.

Where multiple gate drivers are used further variables impact the sharing, e.g.:

differing power supply voltages may directly affect gate charge/discharge timing and/or be directly linked to $dI_c/dt$ (equation 1).

variations in each drivers propagation delay (latency), i.e., the time between receiving a command pulse and the gate drive circuitry changing state; and/or any jitter on these propagation delays: where systems have glitch filters with sampled PWM this can become more of an issue when master clocks between modules are unsynchronised.

Figure 6A:
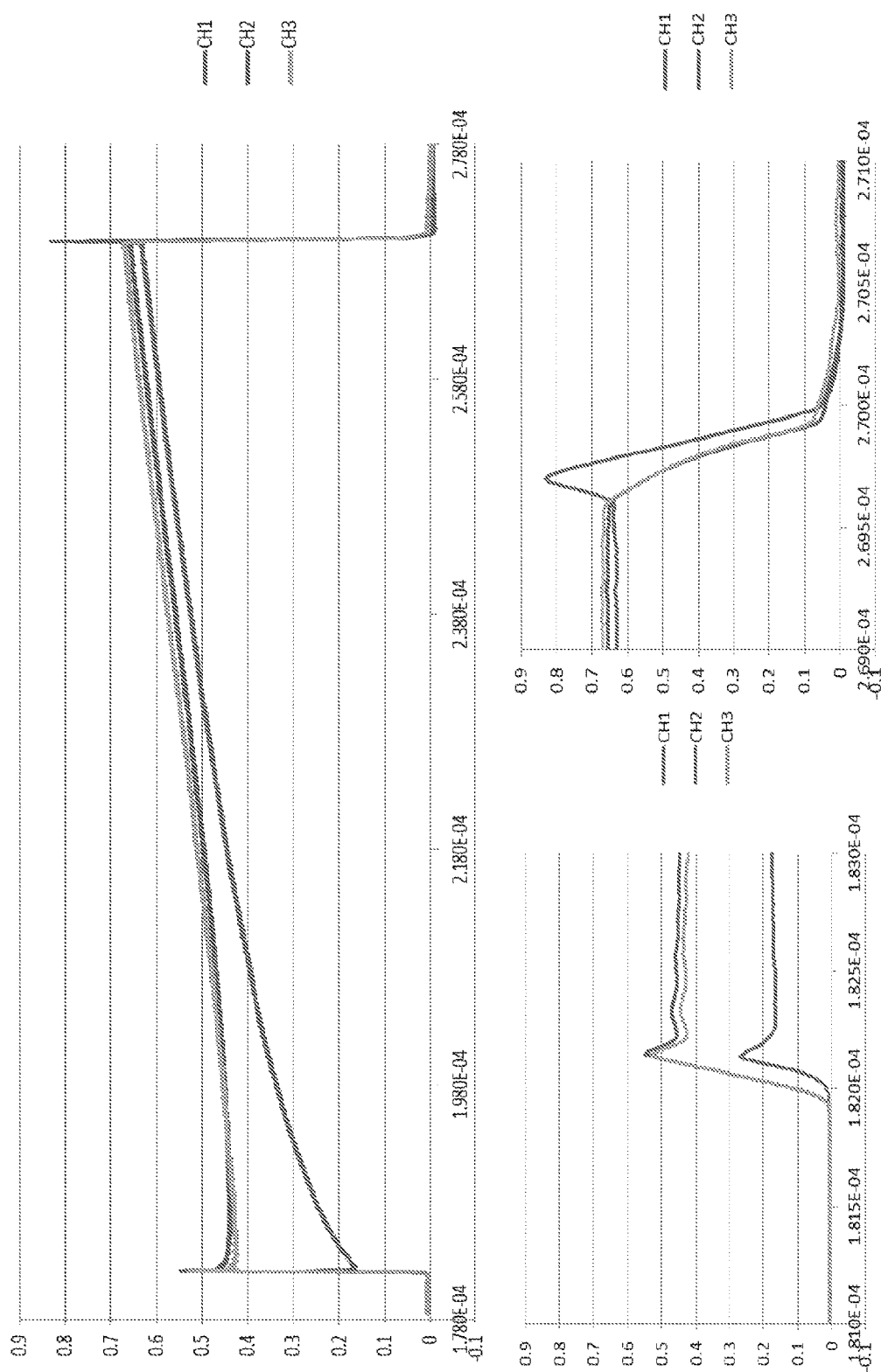
FIG. 6(a) shows sharing performance of three parallel devices (time on the x-axis, relative current on the y-axis)
Figure 6B:
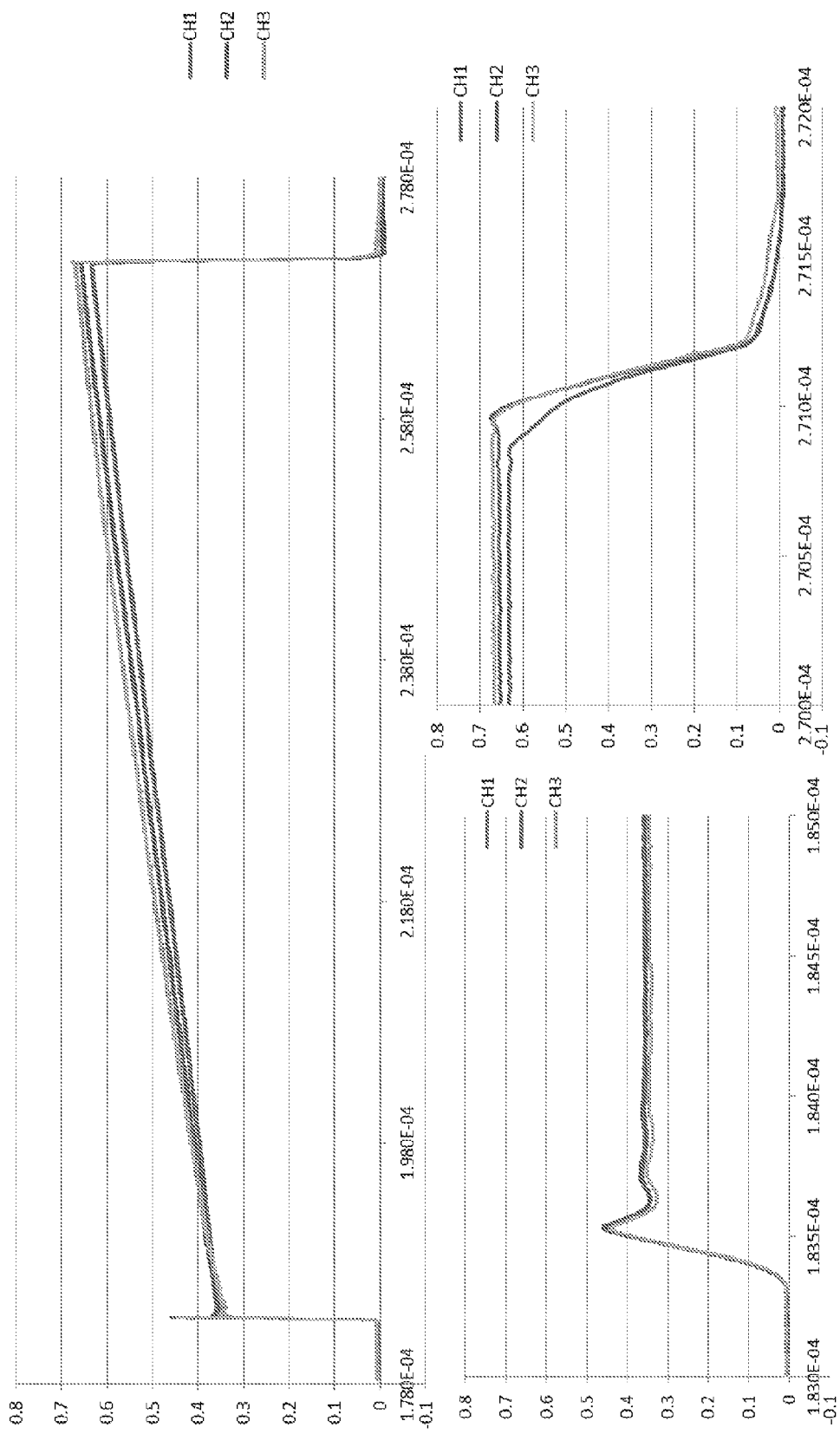
FIG. 6(b) shows sharing performance of three parallel devices in an embodiment having adaptive parallel control enabled (time on the x-axis, relative current on the y-axis)

Turning now to power circuit parasitic inductances, it may be difficult to achieve identical inductance in all parallel power paths and this may directly affect the $dI_c/dt$ and therefore the current balancing. The plot of FIG. 6(a) shows an example of how current sharing moves away from the ideal in a paralleling approach that exhibits these parameter variations. Because of this poor approach that is very typical in existing applications, manufacturers derate the allowed current per IGBT which can significantly impact system cost because more devices are used than would ideally be required in a situation with more ideal current balancing. However, it has been demonstrated that the above waveforms can be aligned with improvement in current balancing, as shown in FIG. 6(b). The results of FIG. 6(b) have been achieved through shifting the turn-on and turn-off signals, to match the rising and falling current edges.

Figure 7:
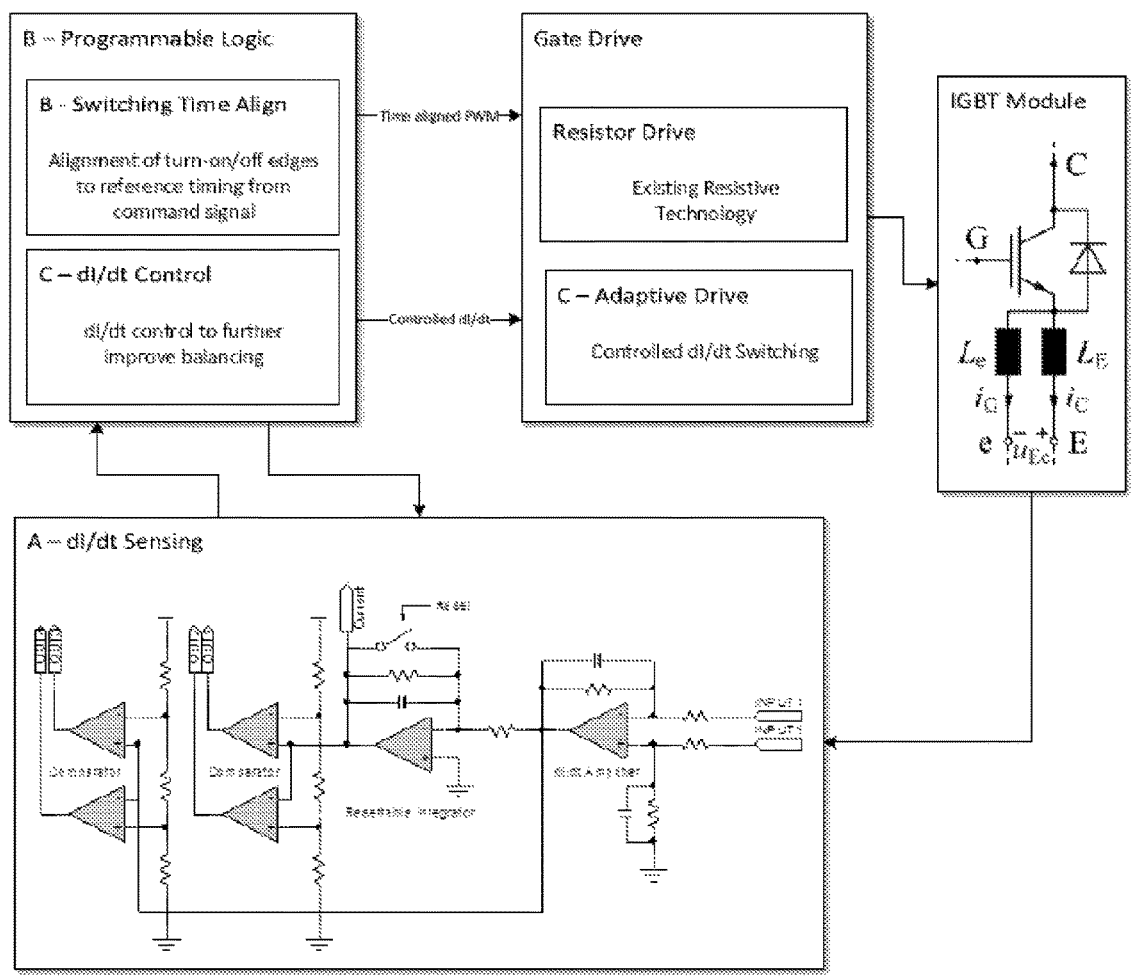
FIG. 7 shows detail of a functional breakdown of an arrangement for synchronising current edges at turn-on and turn-off.

An arrangement that improves upon the limitations of existing solutions by increased alignment of the IGBT switching transitions is shown in FIG. 7. By synchronising the current edges at turn-on and turn-off, and assuming a consistent $dI_c/dt$, the IGBTs may share the load current in a parallel application.

Turning now to measurement techniques, to balance the load current in the parallel connected IGBT modules, a method of either measuring the current through the module or the rate of change of current ($dI_c/dt$) of switching transitions, may be required. To measure the absolute current some kind of dedicated and sometimes relatively expensive sensor may be required. Examples are: shunt resistors; Hall effect sensors; and magneto resistive sensors. Being able to detect the rate of change of current may offer advantages beyond the paralleling feature, including enhanced protection of the IGBT module. In addition there are two practical ways of measuring the $dI_c/dt$ directly on the module with lower cost and/or complexity: Rogowski coil; and module stray (parasitic) inductance—described further below.

Considering specifically $dI_c/dt$ measurement through module stray inductance, a low cost technique to achieve $dI_c/dt$ sensing involves measuring the voltage between the kelvin emitter of the module used for the gate drive reference, and the power emitter. The stray inductance causes a voltage to form when fast changes in current occur. The value of this inductance will vary between different module types, but is generally consistent from module to module of a given type. The following equation applies:

$$V_L = L_E \frac{dI}{dt}$$

where $V_L$=voltage generated across the emitter inductance $L_E$.

Figure 8:
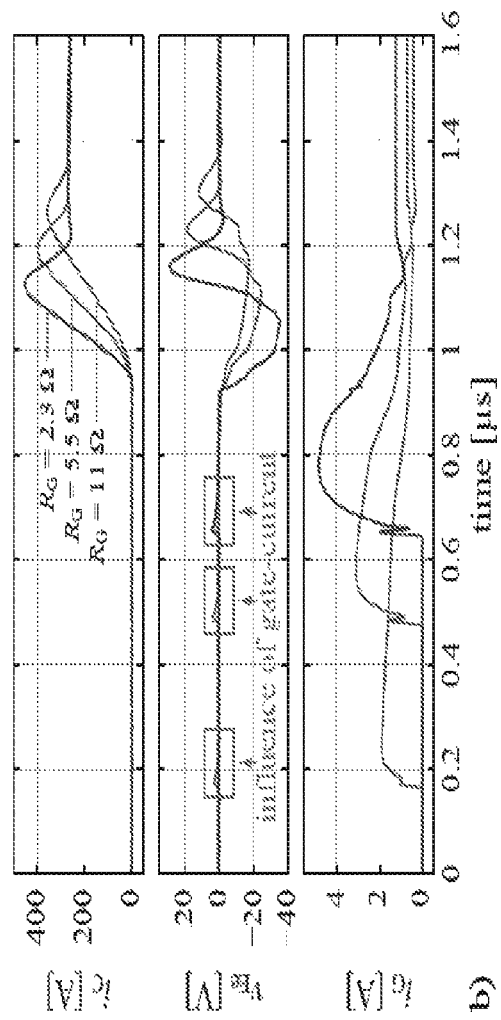
FIG. 8 shows (a) IGBT inductances and (b) observed dI/dt output across Vee.
Figure 8:
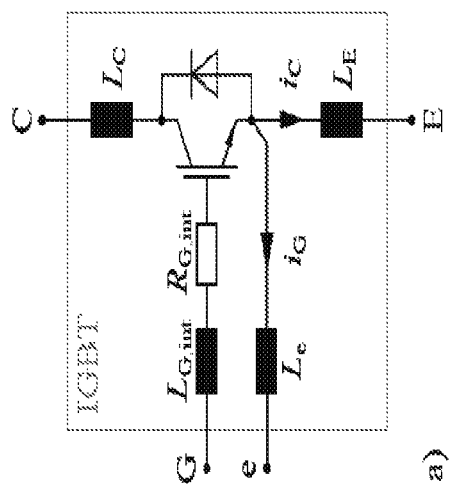

FIG. 8 shows the location of the module inductances and an example of the output obtained from them. It is the collector current (I) through the emitter inductance ($L_E$) that is notable in this technique. These inductances are due to wirebonds and terminals within the device that create what is normally undesired stray parasitics but may be used to advantage in an application. An advantage of this approach is that it may be inherently very low cost. All that may be involved is the arrangement for the connection to the power emitter and a circuit to detect the signal. There may be no actual sensor as this is an integral part of the module.

Regarding sense circuitry, this generally needs to handle the maximum voltage that is seen for any module in the target range whilst still providing sufficient voltage to be effective in resolution with lower output types. The gate current may also be sensed in this loop (see FIG. 8) as it's current return path is through the kelvin emitter (e) terminal of the IGBT. As a result of this the $V_{Ee}$ sense output will also show the effects of $I_G$ interacting with $L_e$. Therefore, the full equation for the output at this point is:

$$V_{Ee} = -L_E \cdot \frac{dI_C}{dt} + L_e \cdot \frac{dI_C}{dt}$$

By way of example, in one 190×140 mm IGBT module $L_E$=3.4 nH and $L_e$=20 nH, typical maximum $dI_c/dt$=10 kA/us, $dI_G/dt$ depends upon the implementation of the drive circuit.

The gate current will potentially cause false output during the initial gate drive turn-on/off and should be blanked during this period. At turn-on this is the period between the initial switching command and when the gate voltage reaches $V_{th}$. At turn off this is the time from the switching command to the end of the miller plateau.

Figure 9A:
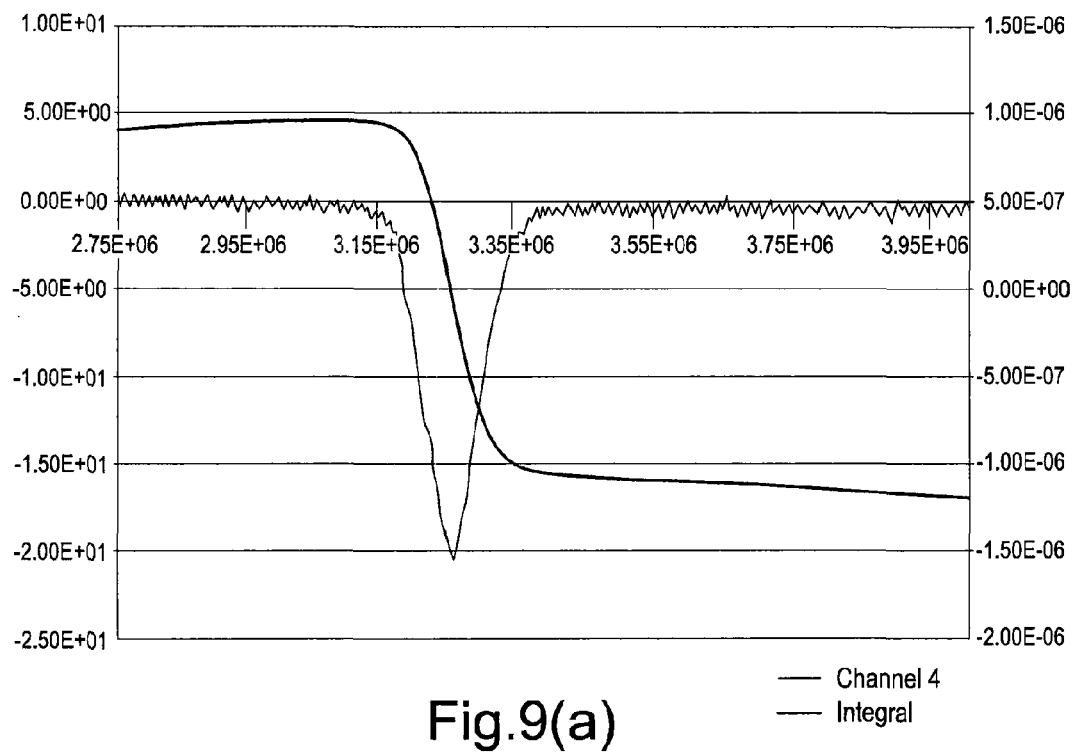
FIG. 9(a) shows measured voltage across emitter inductance at switch on (wherein the smooth line is obtained by integration and the other characteristic is a measurement.
Figure 9B:
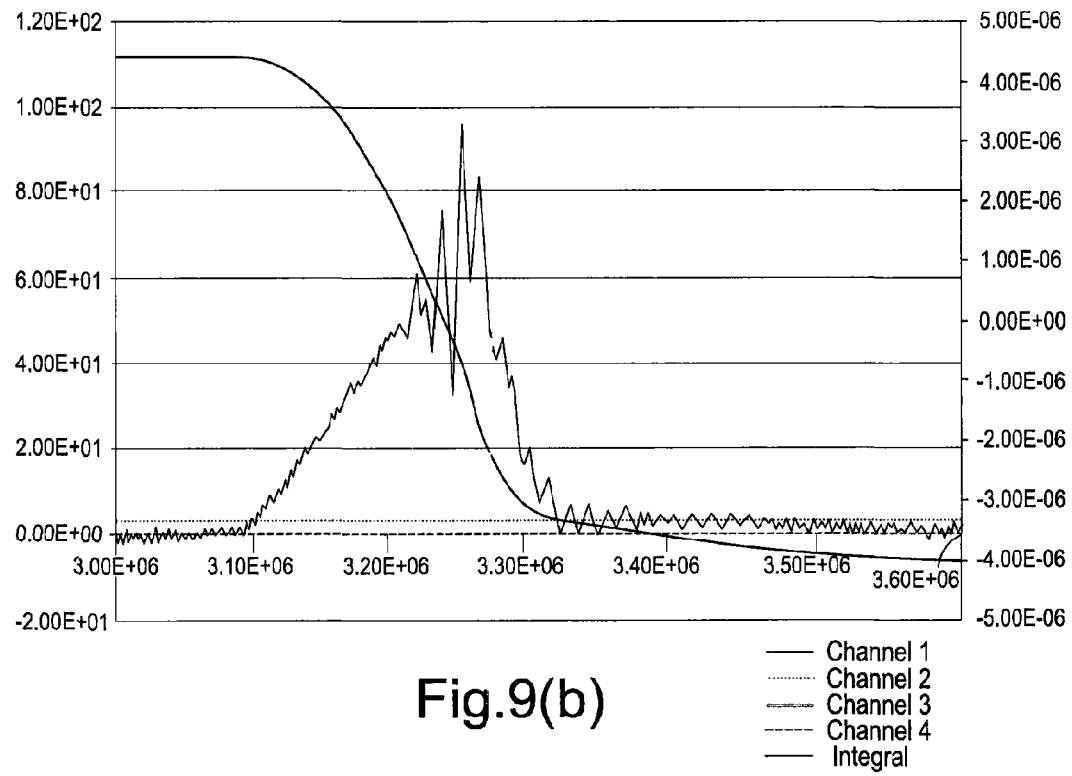
FIG. 9(b) shows measured voltage across emitter inductance at switch off, wherein the smooth characteristic falling from the top left of the graph is an integral and the remaining characteristics are measurements.
Figure 10:
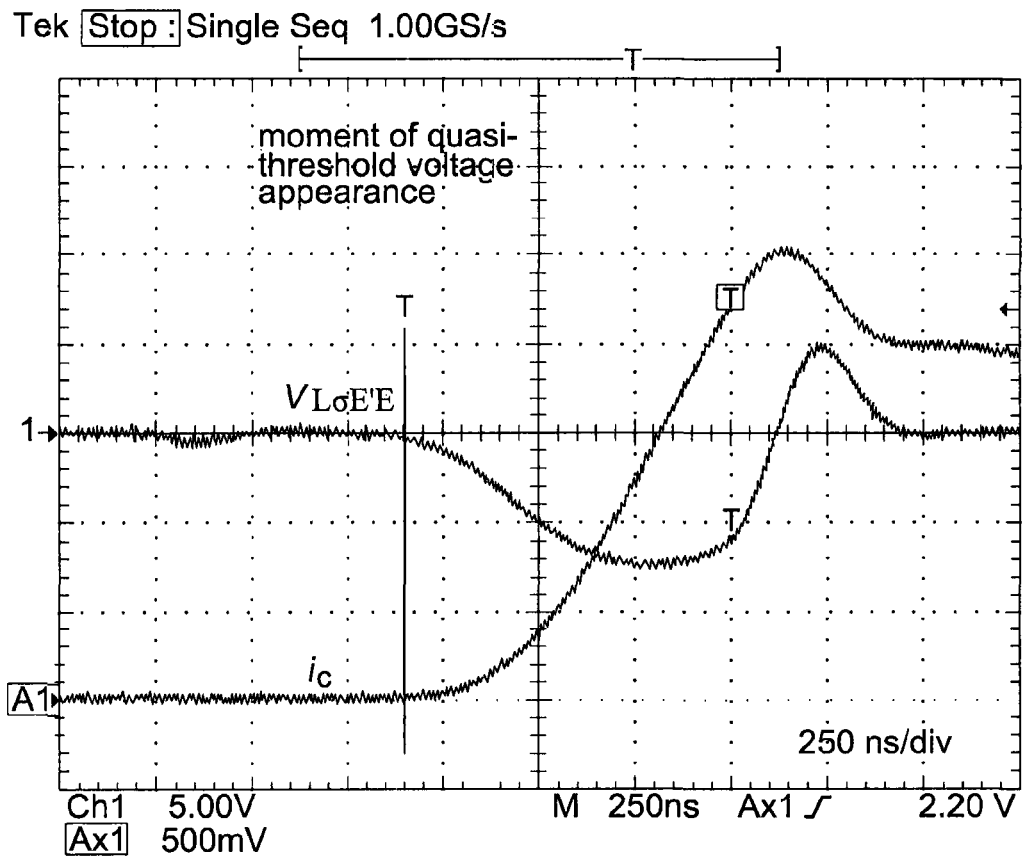
FIG. 10 shows waveforms of collector current ($I_C$, 250 A/div) and parasitic inductance voltage ($-V_{LE}$, 2 V/div) during IGBT turn-on phase, T marks the moment of quasi-threshold voltage appearance.

The sense circuit may comprise a differential amplifier with input stage capability and gains scaled to accept the maximum potential signal. FIGS. 9(a) and 9(b) show measured output on the emitter inductance from a 3.3 kV gate drive at switch on and off respectively. The apparent noise on the second waveform is due to the over voltage clamp firing, injecting current into the gate. The smoother waveform represents the integral of the noisier waveform and demonstrates that the magnitude of the current change can be derived from this data by integration Considering measurement parameters, with the combination of the above two sense circuits a number of events can be determined:

- when a device starts turning on—the positive $dI_c/dt$ transition produces a negative voltage ($V_LEe$) measured across $L_E$. See FIG. 10. This approach generally produces a threshold trigger that is independent of load current. A reliable trigger point that is noise immune should be determined;
- with a resistor drive the $dI_c/dt$ increases from the start of turn-on and a detection is made of when it has reached a predefined level;
- when the $dI_c/dt$ changes polarity at turn-on, which indicates the end of the diode recovery. A disadvantage with this approach is that if one switch turns on first it may see all the recovery current and the other later switches do not exhibit this slope change;
- when a device has reached a given current—integrated $dI_c/dt$. The time when a preset current is reached may be determined. This may have the limitation that no alignment signals can be determined when the converter is operating below this current. This system has the advantage of minimising differences in $dI_c/dt$ slope between parallel devices; and/or
- when a device starts turning off—negative $dI_c/dt$ transition measured as a positive voltage ($V_{Ee}$). The presence of any positive $dI_c/dt$ here indicates misalignment.

Best current sharing performance in a parallel application may require detection of a combination of events.

Turning to edge time alignment, the paralleling system may require a method to read the time of a turn-on or turn-off event of the switch it is controlling, and a system to align these edges with the other devices in the parallel combination. There are a number of approaches to achieving this, but a system where the gate drives could be free standing as standard drives, without any special interface between driver cards that requires an exchange of data is preferable.

By measuring the time between receipt of the turn-on/off signal edge and the IGBT reaching it's threshold or predefined current point in an embodiment, an accurate indication of how long the device is taking to switch as a combination of the IGBT and the attached gate driver is obtained. With this measurement the gate drive can minimise variances in current sharing due to the previous outlined parameter variations.

Two methods to align the timing are considered:

- The gate drives have a fast digital communication path between them. This could communicate the switching event data to determine which device is the slowest, then add delays to slow the others down so that all the switching events occur at the same time. The communications interface may need to either transmit a rising edge with high time accuracy of when a switching event occurred and/or send the magnitude of the current at the end of a turn-on switching cycle and prior to a turn-off event. Although this system generally results in the fastest total switching time (minimised $t_d$ delay time) of the system, it requires a fast inter gate drive communications link;
- The gate drivers being free standing and configuring themselves to set the switching times to a predetermined value. This value is preferably chosen for a particular module as the maximum that could occur with worst case tolerances of all parameters and a safety margin applied. With this system, although there is the disadvantage that the delay time may be slightly longer than with the above approach, it does result in an embodiment in knowing exactly when a switching event will occur and the drives do not require gate drives to communicate with each other. As a result of this they can be free standing products and/or compatible with existing units, e.g., existing control circuitry and/or communication interfaces for communication between control circuitry and drive modules.

Figure 11:
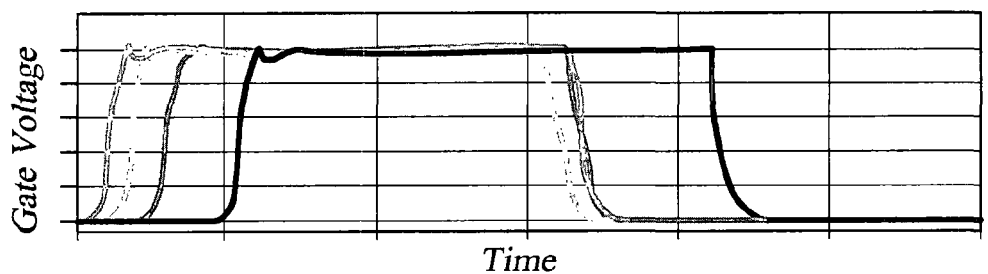

In this regard, FIG. 11 shows paralleled gate signals with offset timing to result in coincident turn-on.

Either system may employ a method to drive all the gate drives with a common, time aligned drive signal.

Regarding time alignment to a reference time as in an embodiment, a system may use the following digital functional blocks:

At Turn-on:

- Counter/timer to start timing from reception of the ON command signal to a trigger from dI/dt sense block. This may be from either the dI/dt comparator or integrator comparator. The output is a count of system clock cycles.
- This counter output may be subtracted from a reference. This reference is a preset in the logic configuration derived for a worst case time for a given module/gate drive combination. The reference will be derived from the worst case timing consideration:
  - Gate drive PSU low tolerance. This is $V_{G+}$-$V_{G-}$. For example, +14V-(-12V)=26V;
  - Gate drive ON resistor maximum tolerance;
  - Maximum IGBT threshold voltage at minimum temperature;
  - Maximum IGBT capacitance.
- The result of this subtraction gives us the number of clock cycles to delay the command signal before switching the next turn-on gate drive command. The delay can be applied all in one step or gradually over time.
- This is recalculated and adjusted on every PWM switching cycle.
- The integrator may be held in reset until a preset time after the gate drive command is issued to blank signals from the gate current initial pulse.
- The integrator reset can be reapplied after a preset time after the gate trigger pulse has been received.

At Turn-Off:

- Use the same delay as turn-on. This is generally simple and may be sufficient to give adequate sharing. However, different tolerances apply to the turn-on as can be demonstrated by the parameters to calculate the reference:
  - Gate drive PSU low tolerance—SAME;
  - Gate drive OFF resistor maximum tolerance—DIFFERENT;
  - Minimum IGBT threshold voltage at maximum temperature—DIFFERENT;
  - Maximum IGBT capacitance—SAME.

This method may also have the disadvantage that real turn-on and turn-off delay times (td) are different because of different characteristics in the IGBT so the output PWN pulse width will not be equal to that input.
time align actual turn-off event, either by sensing dI/dt or the integrated current;
counter/timer to start timing from reception of OFF command signal to trigger from dI/dt sense block where turn-off transition starts;
subtract this from the reference worst case time and determine clock cycle delays to add. The delay can be applied once or gradually.

If a common time reference for turn-on and turn-off is set as the larger of the two references numbers, a current pulse width the same as the PWM command signal may be achieved.

To assist with the above, an IGBT Module Switching Time Calculation Tool may be implemented. A method of deriving the ON/OFF time parameter for a given gate drive/IGBT combination may be required. This may be a spreadsheet but it could be a configuration tool. This allows the following values to be entered and the time parameter will be calculated automatically:

IGBT Values:
  Threshold minimum
  Threshold maximum
  $C_{GS}$ maximum
  Minimum temperature
  Maximum temperature
Gate Drive Values:
  V+ minimum
  V− minimum
  $R_{ON}$ maximum
  $R_{OFF}$ maximum
  Propagation delay maximum (including jitter) from received command to output drive activation.

Regarding distribution of PWM signals and Fault Return Data to all Paralleled Drivers, all the gate drivers in a parallel combination generally require the PWM signal to reach them in close synchronicity. There are three potential approaches to this:

Input to all parallel drivers through standard interface: the host system looks after the distribution of the PWM and status signals to all the paralleled drivers. This may be the simplest approach and mean that the gate drive module can be the same for applications for a single or multiple IGBTs. However, for fibre equipped products this may mean a lot of fibres (and the associated costs). For example, for a 3-phase inverter the system would need 24 fibre connections rather than 6 when using 4 IGBTs in parallel;

Gate Drivers equipped with inter-module communications link: gate drive modules may have connectors allowing them to be linked together. In this way the PWM and status connections can go to one driver from the control system and these connections allow the signals to be distributed to the other paralleled cards. A potential advantage is the elimination of the need for multiple connection requirements from the host system. Potential disadvantage(s) may be: for the gate driver to be standardised, there may be redundant isolated connections on every board that is slaved; in passing the PWM to other drives latency may need to be tightly controlled and known so that it can be compensated for; and/or there may need to be a mechanism for combining the return data channels.

A parallel distribution board: a separate board dedicated to parallel signal distribution and combination of return data channels has a number of potential advantages: tight alignment of PWM signals to all drives; and/or act as an isolation bridge between the host system connections (fibre or electrically isolated) and the lesser isolation requirements of parallel devices. The board may incorporate the following capability: receive the system PWM and distribute to all the paralleled drivers with tightly controlled synchronicity; receive the status lines from all paralleled devices and combine them for return to the host system. The status line may indicate a fault if any of the connected IGBTs indicate one. In addition it may only acknowledge the PWM when ALL have acknowledged; receive the system data channel and direct it to all gate drive modules; receive the return data channel from all connected drivers and provide a mechanism to concentrate it onto a single return channel; provide logic to protect all the IGBTs if one of them indicates a fault; and/or receive the system power and distribute to all connected cards.

Figure 12A:
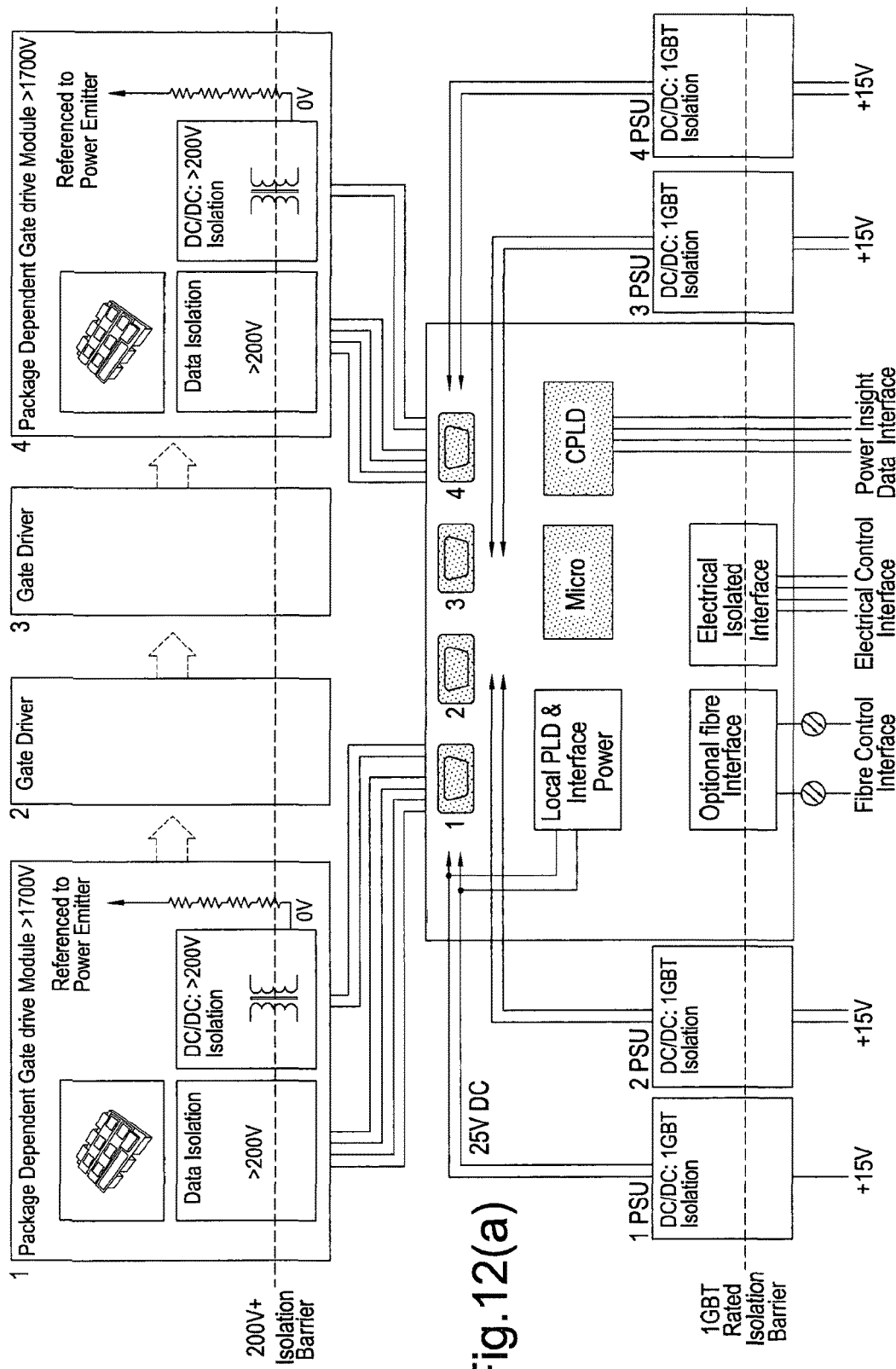
FIGS. 12(a) and 12(b) show example parallel system architectures.
Figure 12B:
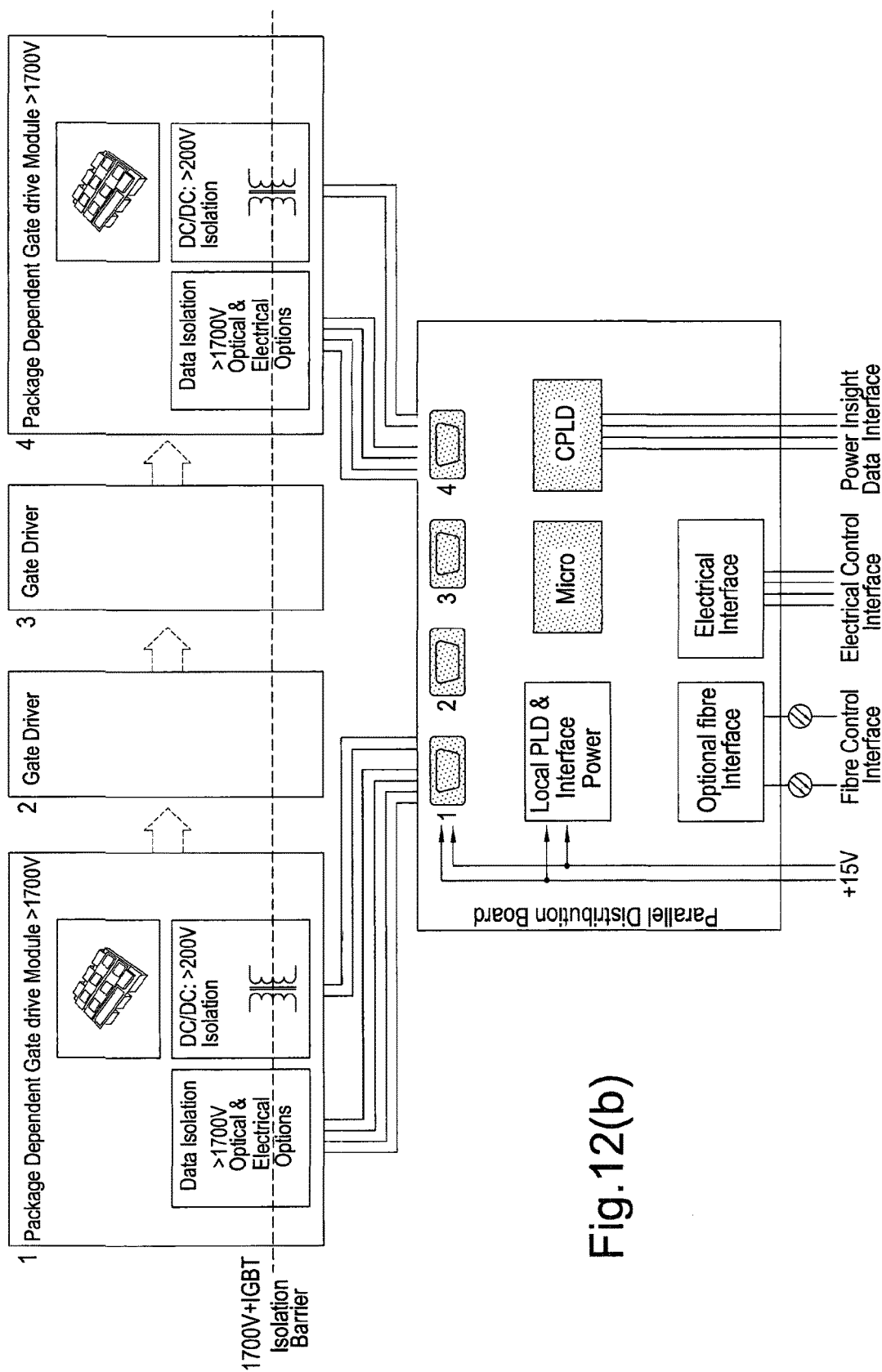

Two versions of a system are shown in FIGS. 12(*a*) and 12(*b*). The architecture of FIG. 12(*a*) is generally suitable for all gate drive types and IGBT voltages. The architecture of FIG. 12(*b*) is an alternative where the isolation requirements can be physically accommodated on the gate drive. Typically this means for IGBTs of 1700V and below.

Considering additional benefits gained through the implementation of this technology, the above approach is generally applicable to standard resistor based gate drives, but can equally be applied to an adaptive current drive. With such an adaptive current drive, rather than introducing delays to align the switch on time, the drive current can be adjusted to achieve alignment. Through the implementation of the sensors and alignment to facilitate this parallel solution some further benefits can be exploited, e.g.:

where the exact point in time relative to the PWM command that the switching event will take place is known, dead-time management within the system becomes easier. This potentially allows a reduced dead-time to be used which lowers line harmonics in grid tied systems;

the dI/dt sensor can also be used in an adaptive drive system to signal change in drive current;

the integrated current output of the dI/dt sensor can be used to implement a faster short-circuit or over-current protection system; and/or a measurement of current, at the switching edges, is available (an example implementation allows us to measure current at the switching edges only), which if processed using a suitable analog-to-digital converter (ADC) can provide a measure of instantaneous or average current to the host system (via the return data channel).

Figure 14:
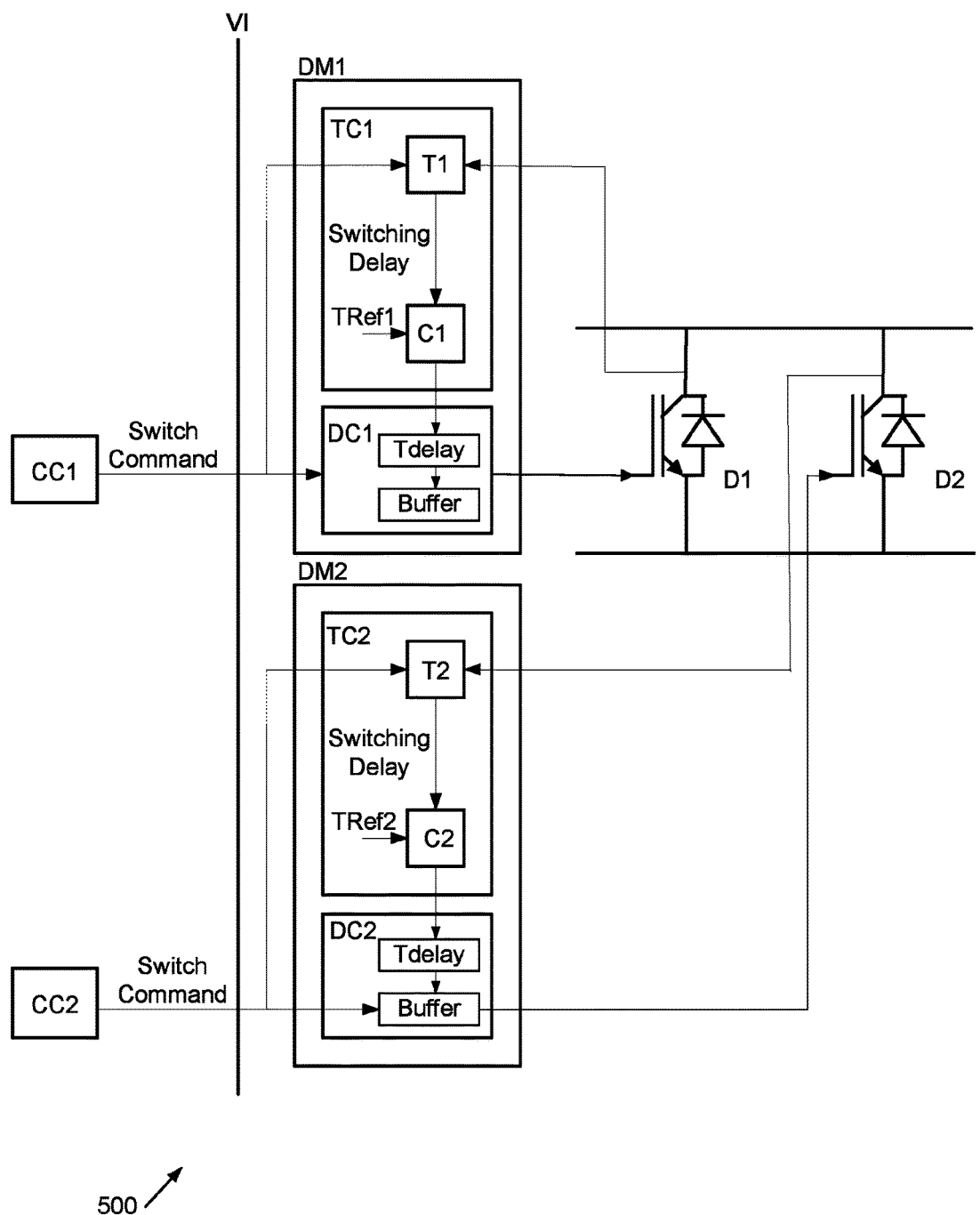
FIG. 14 shows a block diagram of a circuit embodiment for controlling switching of parallel coupled power semiconductor switching devices.

An example block diagram of a circuit 500 for controlling parallel coupled power semiconductor switching devices is shown in FIG. 14 (noting that while FIG. 14 shows two devices, such controlled devices may comprise two or more power semiconductor switching devices in parallel). Such an embodiment may comprise: power semiconductor switching devices D1, D2; drive modules DM1, DM2; control circuitry CC1, CC2 (alternatively these may be combined as one unit); voltage isolation VI; timing circuitry TC1, TC2 receiving a switching delay and a reference delay Tref; and/or delay circuitry DC1, DC2 each to provide a controllable time delay Tdelay. The timing control circuitry may comprise a timer T1/T2 and/or a comparison circuit C1/C2.

The delay control circuitry may comprise a timer circuit (indicated by Tdelay) and a buffer for delaying the switch command passage accordingly.

It is noted that the above description generally refers to embodiments for current balancing/sharing of parallel devices. In this regard, it is noted that a slight mismatch of timing generally will not destroy a device of a parallel arrangement, whereas with voltage balancing of series connected devices a mismatch could instantly kill the device. Nevertheless, the timing measurement scheme of an embodiment can be applied to voltage balancing, i.e., the controlled power switching devices may be in series.

The invention further provides processor control code to implement any of the above-described tools, system and control procedures, for example on an embedded processor. The code may be provided on a carrier such as a disk, CD- or DVD-ROM, programmed memory such as read-only memory (Firmware), or on a data carrier such as an optical or electrical signal carrier. Code (and/or data) to implement embodiments of the invention may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog (Trade Mark) VHDL (Very high speed integrated circuit Hardware Description Language). As the skilled person will appreciate such code and/or data may be distributed between a plurality of coupled components in communication with one another.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A circuit for controlling switching of parallel coupled power semiconductor switching devices, the circuit comprising:
    a plurality of drive modules each controlling a respective power semiconductor switching device;
    control circuitry to transmit switch command signals to the modules, each switch command signal to trigger a said drive module to control a said power semiconductor switching device to switch state; and
    voltage isolation between the drive modules and the control circuitry, wherein each drive module for controlling a said device comprises:
    timing circuitry to compare a switching delay of the device and a reference delay, wherein the switching delay is a time interval between detecting a said switching command signal at the drive module and switching of the device in accordance with the detected switching command signal; and
    delay circuitry to provide a controllable delay to delay a said triggering by a said switching command signal received at the module subsequent to the detected switching command signal, the delay circuitry configured to control the controllable delay according to a result of the comparison of the switching delay of the device, to thereby reduce a time difference between the reference delay and a said switching delay of the device switching in accordance with the subsequent switching command signal.

2. The circuit of claim 1, wherein the timing circuitry comprises a timer to measure the switching delay of the device, the timing circuitry configured to perform the comparison by comparing the measured switching delay and a stored value of the reference delay, wherein the subsequent time difference reduction is relative to the measured time difference.

3. The circuit of claim 2, configured to, in response to each of a series of said measured time differences of a module, control a said controllable delay of the module to thereby reduce a following the time difference of the module by an amount less than the measured time difference, such that successive the time differences of the series converge toward zero.

4. The circuit of claim 1, wherein the timing circuitry comprises a timer to indicate the end of a duration equal to the reference delay and starting from the command signal detection, the timing circuitry configured to perform the comparison comprising detecting whether the switching of the device occurs before, at and/or after the indicated end.

5. The circuit of claim 1, wherein each drive module is configured to perform a said comparison based on a reference delay of the module, the reference delays of the modules having values to substantially synchronize switching of the power switching devices when switching command signals to trigger control of the devices to switch state are received by the modules substantially simultaneously, preferably wherein the values are equal.

6. The circuit of claim 1, wherein each drive module is configured to implement a said control of a said controllable delay, to thereby decrease variance among currents conducted by the devices when the devices are simultaneously on.

7. The circuit of claim 1, wherein the control circuitry is configured to control when each drive module performs a said controllable delay control.

8. The circuit of claim 1, wherein the delay circuitry comprises a controllable timer and is configured to adjust a timing period value of the timer to implement the controllable delay, the timer preferably configured to control a buffer delay time of a said switching command signal, and/or wherein the delay circuit is configured to adjust a drive strength of the subsequent switching command signal to thereby implement the controllable delay.

9. The circuit of claim 1, wherein at least one the drive module for controlling a said device is configured to measure a first the time difference of the module and a second the time difference of the module, wherein:
    the first measured time difference is a turn on time difference between a first the reference delay and a said switching delay of the device turning on; and
    the second measured time difference is a turn off time difference between a second the reference delay and a said switching delay of the device turning off,
    wherein the drive module is configured to:
    control a said controllable delay of the drive module according to the turn on time difference to thereby reduce a subsequent the turn on time difference of the drive module; and
control a said controllable delay of the drive module according to the turn off time difference to thereby reduce a subsequent the turn off time difference of the drive module,
    wherein the turn on reference delay and the turn off reference delay are substantially equal.

10. A bridge circuit comprising the circuit of claim 1, wherein the power semiconductor switching devices comprise lower and upper switching devices of a phase leg of the bridge circuit, wherein:
    a said drive module is configured to perform a said comparison and a said controllable delay control based on the comparison, to thereby control delay of a said triggering by a said switch command signal received at the drive module for controlling the lower device; and a said drive module is configured to perform a said comparison and a said controllable delay control based on the comparison, to thereby control delay of a said triggering by a said switch command signal received at the drive module for controlling the upper device, the bridge circuit to thereby reduce a dead time between switching of the lower and upper devices.

11. The circuit of claim 1, comprising a fiber-optic interface, the control circuitry configured to perform the switch command signal transmission via said fiber-optic interface.

12. The circuit of claim 1, comprising a dedicated electrical interface for the switch command signal transmission, the control circuitry configured to perform the switch command signal transmission via said dedicated electrical interface.

13. The circuit of claim 1, wherein the power semiconductor switching devices comprise at least one IGBT.

14. A power converter comprising the circuit of claim 1.

15. A method of controlling switching of parallel coupled power semiconductor switching devices, the method using control circuitry to transmit switch command signals to drive modules, the drive modules voltage isolated from the control circuitry, each switch command signal to trigger a said drive module to control a said power semiconductor switching device to switch state, the method comprising performing for each device the steps of:

comparing at a said drive module a switching delay of a said device and a reference delay, wherein the switching delay is a time interval between detecting a said switch command signal at the drive module and switching of the device in accordance with the detected switching command signal; and controlling a controllable delay of the drive module to delay at least one the triggering by a said switch command signal subsequent to the detected switch command signal, the controlling according to a result of the comparison, to thereby reduce a time difference between the reference delay and a said switching delay of the device in accordance with the subsequent switching command signal.

16. The method of claim 15, comprising:

performing the steps for a said power semiconductor switching device, wherein the switching of a said device comprises the device turning on;

performing the steps for the said power semiconductor switching device, wherein the switching of a said device comprises the device turning off;

wherein the reference delay compared to a switching delay of the turning on of the device and the reference delay compared to a switching delay of the turning off of the device are substantially equal.

17. The method of claim 15, wherein the power semiconductor switching devices comprise lower and upper devices in a phase leg of a bridge circuit, the method comprising performing the steps for each of the lower and upper devices, to reduce a dead time between switching of the lower and upper devices.

18. The method of claim 15, wherein the comparison comprises measuring at the drive module a time difference between the reference delay and the switching delay of the device and comparing the measured time difference and a stored value of the reference delay, wherein the reduced time difference is relative to the measured time difference.

19. The method of claim 15, wherein a said controlling said controllable delay comprises a series of adjustments of a controllable delay element over a plurality of switching cycles of the device, to thereby reduce a said time difference gradually.

20. The method of claim 15, comprising determining a turn on reference delay for a said comparison to a said switching delay of a said device, a said switching delay being a turn on delay of the device relative to a said trigger to turn the device on, the determining on the basis of at least one of:

a compliance voltage of a power supply for powering at least one the drive module;

maximum input resistance of a terminal to drive the power semiconductor switching device in an on state;

a maximum turn-on threshold voltage of the power semiconductor switching devices, preferably at a minimum desired temperature; and/or a maximum control terminal capacitance of the power semiconductor switching devices.

21. The method of claim 15, comprising determining a turn off reference delay for a said comparison to a said switching delay of a said device, a said switching delay being a turn off delay of the device relative to a said trigger to turn the device off, the determining on the basis of at least one of:

a compliance voltage of a power supply for powering at least one the drive module;

maximum input resistance of a terminal to drive the power semiconductor switching device in an off state;

a minimum turn-off threshold voltage of the power semiconductor switching devices, preferably at a maximum desired temperature; and/or a maximum control terminal capacitance of the power semiconductor switching devices.

22. The method of claim 20, wherein each reference delay to be used for a the comparison is determined to be equal to the larger of the determined turn on reference delay and the determined turn off reference delay.

23. A computer program operable to determine a said reference delay for the method of claim 15, the determining on the basis of at least one of:

a minimum power semiconductor switching device turn-off threshold voltage, preferably at a maximum desired temperature;

a maximum power semiconductor switching device turn-on threshold voltage, preferably at a minimum desired temperature;

a maximum power semiconductor switching devices control terminal capacitance;

a minimum temperature;

a maximum temperature;

a minimum positive supply voltage to a drive module;

a maximum negative supply voltage to a drive module;

a maximum input resistance of a terminal to drive a said power semiconductor switching device in an on state;

a maximum input resistance of a terminal to drive a said power semiconductor switching device in an off state;

a maximum propagation delay of a said drive module for driving a said power switching device, the delay from receiving a switch command signal at the drive module to the drive module activating switching of the power semiconductor device.

24. A circuit for controlling switching of parallel coupled power semiconductor switching devices, the circuit comprising control circuitry to transmit switch command signals to drive modules, each switch command signal to trigger a said drive module to control a said power semiconductor switching device to switch state, the circuit comprising for each drive module:

means for comparing at a said drive module a switching delay of a said device and a reference delay, wherein the switching delay is a time interval between detecting a said switch command signal at the drive module and switching of the device in accordance with the detected switching command signal; and means for controlling a controllable delay of the drive module to delay at least one the triggering by a said switch command signal subsequent to the detected switch command signal, the controlling according to a result of the comparison, to thereby reduce a time difference between the reference delay and a said switching delay of the device in accordance with the subsequent switching command signal.

25. A bridge circuit comprising circuitry for controlling switching of power semiconductor switching devices, the circuit comprising:

a plurality of drive modules, each module for controlling a said power semiconductor switching device;

control circuitry to transmit switch command signals to the modules, each switch command signal to trigger a said drive module to control a said power semiconductor switching device to switch state; and voltage isolation between the drive modules and the control circuitry, wherein each drive module for controlling a said device comprises:

timing circuitry to compare a switching delay of the device and a reference delay, wherein the switching delay is a time interval between detecting a said switching command signal at the drive module and switching of the device in accordance with the detected switching command signal; and delay circuitry to provide a controllable delay to delay a said triggering by a said switching command signal received at the module subsequent to the detected switching command signal, the delay circuitry configured to control the controllable delay according to a result of the comparison of the switching delay of the device, to thereby reduce a time difference between the reference delay and a said switching delay of the device switching in accordance with the subsequent switching command signal, wherein the power semiconductor switching devices comprise lower and upper switching devices of a phase leg of the bridge circuit, wherein:

a said drive module is configured to perform a said comparison and a said controllable delay control based on the comparison, to thereby control delay of a said triggering by a said switch command signal received at the drive module for controlling the lower device; and a said drive module is configured to perform a said comparison and a said controllable delay control based on the comparison, to thereby control delay of a said triggering by a said switch command signal received at the drive module for controlling the upper device, the bridge circuit to thereby reduce a dead time between switching of the lower and upper devices.

26. A method of controlling switching of power semiconductor switching devices, the method using control circuitry to transmit switch command signals to drive modules, the drive modules voltage isolated from the control circuitry, each switch command signal to trigger a said drive module to control a said power semiconductor switching device to switch state, the method comprising performing for each device the steps of:

comparing at a said drive module a switching delay of a said device and a reference delay, wherein the switching delay is a time interval between detecting a said switch command signal at the drive module and switching of the device in accordance with the detected switching command signal; and controlling a controllable delay of the drive module to delay at least one the triggering by a said switch command signal subsequent to the detected switch command signal, the controlling according to a result of the comparison, to thereby reduce a time difference between the reference delay and a said switching delay of the device in accordance with the subsequent switching command signal, wherein the power semiconductor switching devices comprise lower and upper devices in a phase leg of a bridge circuit, the method comprising performing the steps for each of the lower and upper devices, to reduce a dead time between switching of the lower and upper devices.

\* \* \* \* \*